(12) United States Patent
Bales

(10) Patent No.: US 7,282,948 B2
(45) Date of Patent: Oct. 16, 2007

(54) MOS LINEAR REGION IMPEDANCE CURVATURE CORRECTION

(75) Inventor: Tim J. Bales, Warfield (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/804,699

(22) Filed: Mar. 19, 2004

(65) Prior Publication Data

US 2005/0088199 A1 Apr. 28, 2005

(30) Foreign Application Priority Data

Oct. 28, 2003 (GB) ................................ 0325147.7

(51) Int. Cl.
*H03K 17/16* (2006.01)
(52) U.S. Cl. ........................................ 326/30; 327/381
(58) Field of Classification Search .................. 326/30, 326/83, 86; 327/108, 112, 380, 381
See application file for complete search history.

(56) References Cited

U.S. PATENT DOCUMENTS

| | | | |
|---|---|---|---|
| 5,134,311 A * | 7/1992 | Biber et al. ................. | 327/108 |
| 5,396,028 A | 3/1995 | Tomassetti | |
| 6,137,273 A | 10/2000 | Bales et al. | |
| 6,181,170 B1 | 1/2001 | Koifman | |
| 6,470,054 B1 | 10/2002 | Boudry et al. | |
| 6,504,397 B1 | 1/2003 | Hart et al. | |
| 6,509,765 B1 | 1/2003 | Drost | |
| 6,577,154 B2 | 6/2003 | Fifield et al. | |
| 2002/0089351 A1 | 7/2002 | Stockstad | |
| 2002/0180479 A1 | 12/2002 | Chang | |
| 2003/0062920 A1 | 4/2003 | Radhakrishnan | |

* cited by examiner

*Primary Examiner*—Daniel Chang
(74) *Attorney, Agent, or Firm*—Jones Day; Edward L. Pencoske

(57) ABSTRACT

A system and method to correct or cancel MOS linear region impedance curvature employing an analog solution to trim out the MOS linear region impedance curvature while accommodating PVT spreads in values of internal or external precision resistors. The linear region curvature correction may be obtained by using two MOS transistors in the pad driver/buffer and operating the transistors so as to proportionately increase output impedance of one of them when the output impedance of the other decreases, and vice versa. A linear pad impedance may be maintained over a range of Vpad values, while also maintaining the Vgs supplied to pad driver transistors at its maximum possible value to obtain greater linearity. The approach of the present disclosure relaxes the requirements on the voltage/current references used in the MOS pad drivers and makes tight impedance control possible, especially in a situation where the MOS fabrication process (typically all currently used processes) does not have available an internal precision resistor with a reasonably well controlled value.

38 Claims, 19 Drawing Sheets

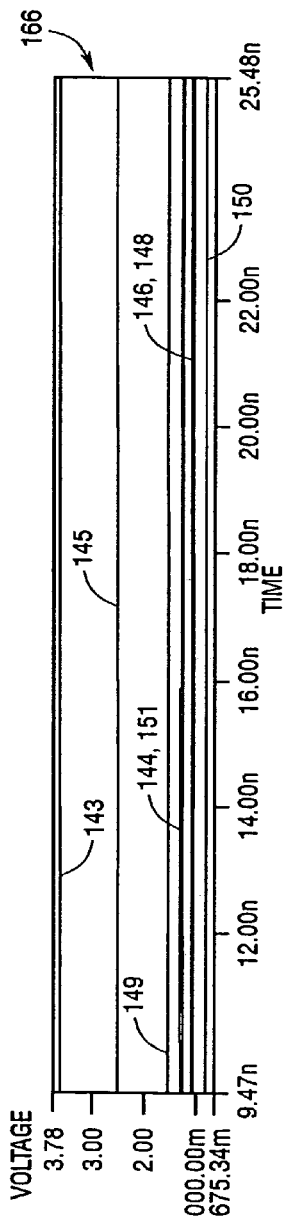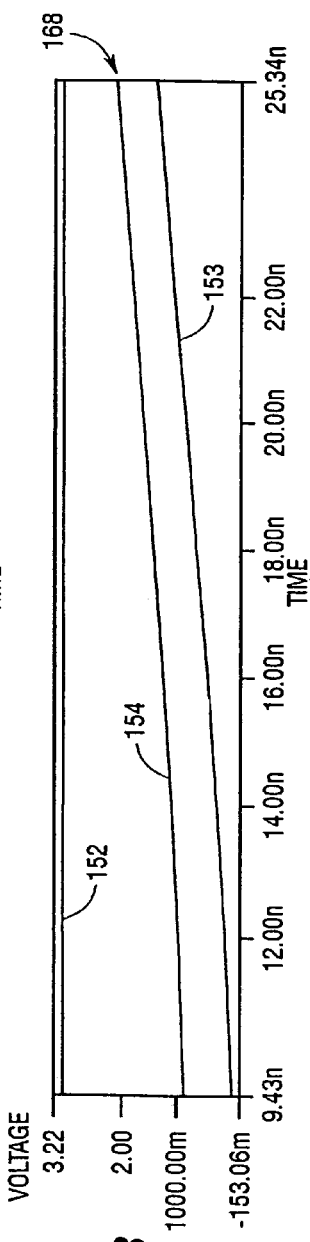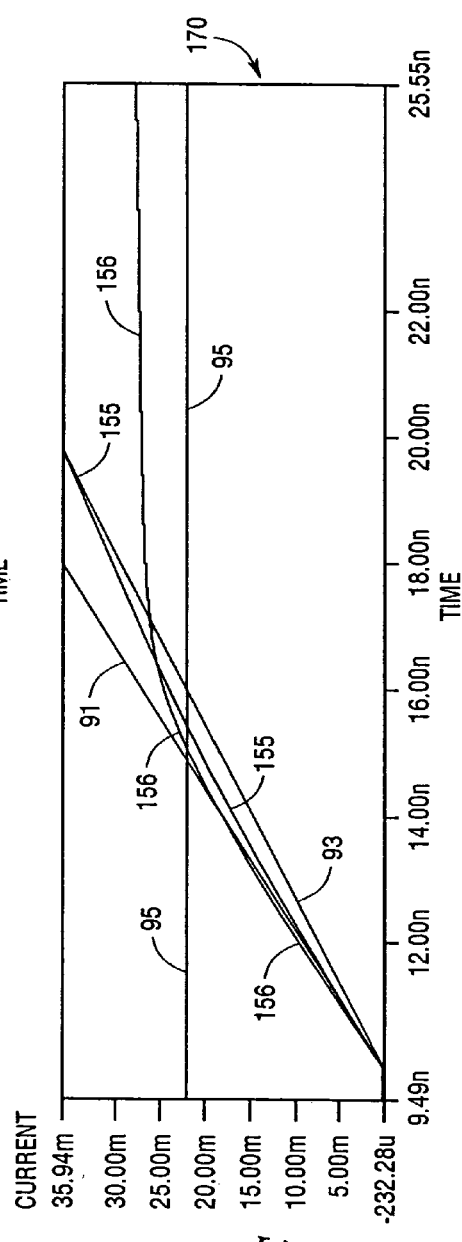

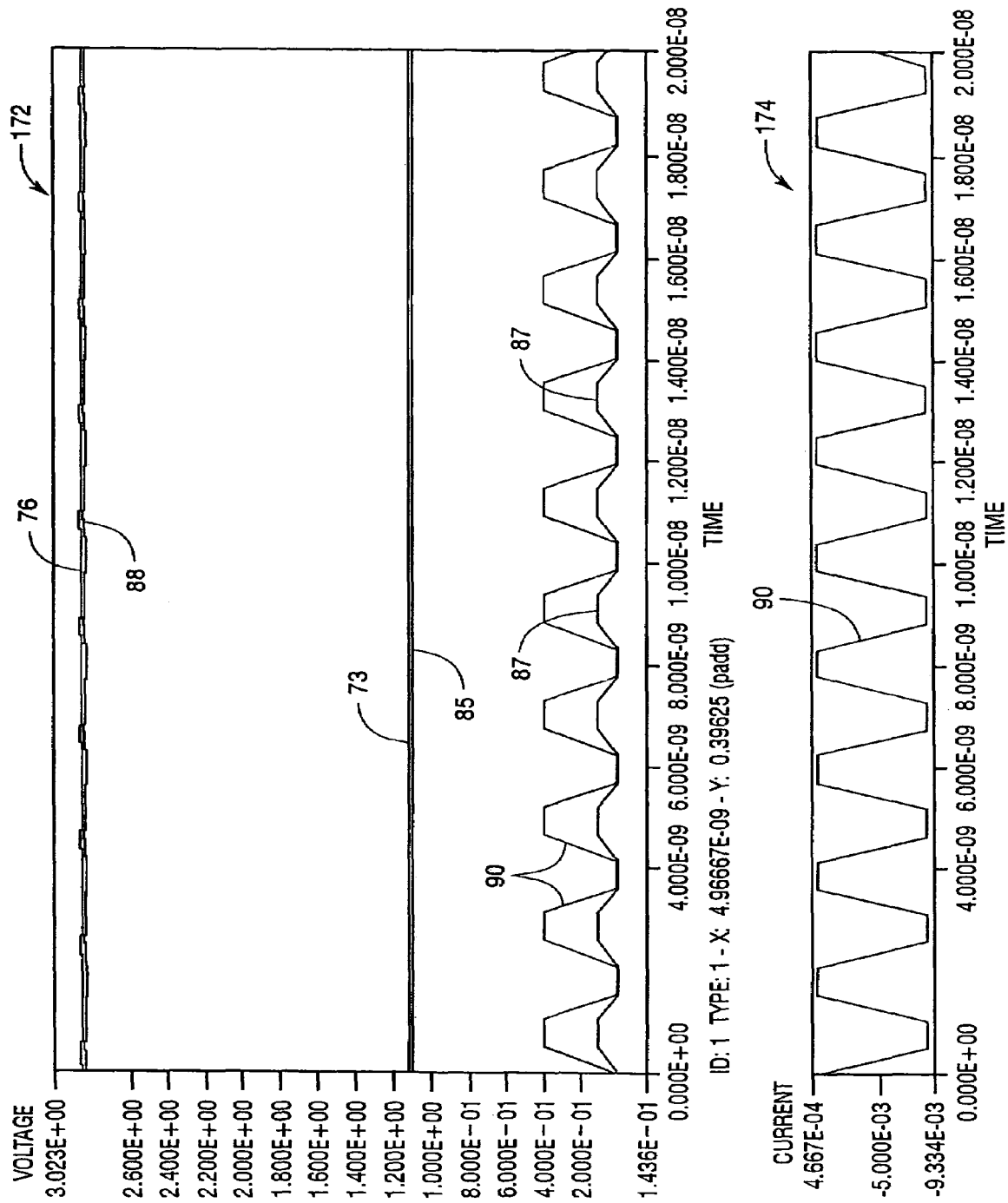

MOS LINEAR REGION IMPEDANCE CURVATURE CORRECTION

BACKGROUND

1. Field of the Disclosure

The present disclosure broadly relates to pad impedance in MOS (Metal Oxide Semiconductor) driver circuits and, more particularly, to an apparatus and method to correct MOS linear region impedance curvature.

2. Brief Description of Related Art

The high speed I/O standards governing data transfers between two high speed electronic devices require a tight control of output impedance of a device driver or buffer circuit in such devices. In modern I/O standards, the output impedance is required to be controlled to a nominal value +/− some percentage error or variation. For example, FIG. 1 illustrates an exemplary pad impedance specification 10 under USB2.0 (Universal Serial Bus version 2.0) for a low impedance driver circuit. An example of a low impedance drive unit is a USB1.1 (Universal Serial Bus version 1.1) buffer circuit within a USB2.0 PHY (Physical Layer) device. The specifications mandated in the chart in FIG. 1 may apply to such USB1.1 buffer circuits. In USB2.0, the output impedance of a driver circuit or buffer unit must be controlled within 45 Ohms +/− 10% of tolerance. Therefore, the allowable range of output impedance becomes from 40.5 Ohms to 49.5 Ohms. This allowable range is shown by the shaded portion in FIG. 1. It is observed from FIG. 1 that such impedance control applies over a certain voltage range on a drive circuit output pad (i.e., the voltage range of Vpad shown in FIG. 2 and discussed later hereinbelow.) In case of USB2.0, this voltage range is from 0V to 1.1V. Beyond Vpad=1.1V, the pad impedance (Rpad in equation (1) given hereinbelow) is allowed to increase as seen from the spread of the shaded region in FIG. 1.

The discussion herein uses the terms "pad" or "integrated circuit pad" interchangeably to refer to an electrically conducting junction or outlet for a circuit that is fabricated using a semiconductor fabrication process (e.g., a CMOS fabrication process). The pad for the circuit allows the circuit to be connected to another circuit on the same integrated circuit (IC) chip or to another circuit or device external to the chip containing the circuit with the terminating pad.

FIG. 2 illustrates a general approach to pad impedance control in a MOS driver circuit 12. The MOS driver circuit 12 is fabricated as part of an integrated circuit (IC) and includes an n-channel MOS transistor M1(14) having its gate terminal 16 connected to a bias voltage Vgs (denoted as a gate-to-source voltage source 17), its source terminal 18 held at a ground potential, and its drain terminal 20 connected to the integrated circuit's or chip's output pad (IC pad) 24 via a series resistor Rs 22—also referred to interchangeably herein as an internal precision resistor, an internal linearizing resistor or an internal termination resistor. The internal linearizing resistor 22 is typically integrally fabricated (i.e., on the same chip) with the MOS transistor 14. As discussed hereinbelow, an external precision resistor (not shown) may also be used instead of the internal one. The voltage present at the output pad (e.g., when another electronic device is connected to the IC containing the driver circuit 12) is denoted by the variable pad voltage source Vpad 26. In the circuit configuration of FIG. 2, the impedance present at the IC pad 24 may be given by the following equation:

$$R_{pad} = \frac{V_{pad}}{I_{pad}} = R_s + \frac{1}{\beta\left(V_{gs} - V_T - \frac{V_{ds}}{2}\right)} \text{ where} \quad (1)$$

$$\beta = \left(\frac{\mu_o}{C_{ox}}\right)\left(\frac{W}{L}\right) \quad (2)$$

It is noted here that equation (1) neglects the effects of channel length modulation, λ. In equation (1), Rs is the internal linearizing resistor 22, Vgs is the gate-to-source voltage 17, $V_T$ is the appropriate threshold voltage (for NMOS or PMOS), Vds is the drain-to-source voltage present in the transistor M1, and β is the transconductance of the MOS device 14 (in mA/Volt). As is known in the art, the value of β is as defined in equation (2), in which $\mu_0$ is the surface mobility of the channel (holes for p-channel or electrons for n-channel) given in (cm$^2$/volt.second), $C_{ox}$ is the MOS gate capacitance per unit area (in F/cm$^2$), W is MOS device's effective channel width (cm), and L is MOS device's effective channel length (cm).

It is noted that different MOS fabrication technologies may have different values for $\mu_0$ and $C_{ox}$. If $\mu_0$ and $C_{ox}$ are low, then the width-to-length ratio W/L (i.e., the size of the MOS device) needs to be made very large to compensate for the lower μo and Cox values, thereby maintaining the impedance control for Rpad in equation (1). It is further noted that the equations (1) and (2) apply to the MOS transistor M1 in its linear region (i.e., the region between cutoff and saturation) of operation. The linear region of operation of the MOS transistor 14 with an internal linearizing resistor 22 is shown in the two pad or "output" current (Ipad) versus pad or output voltage (Vpad) graphs (the transconductance graphs) 28, 30 in FIG. 2. In the linear region, the curvature of the Ipad-Vpad graph 28 is small with large value of Vgs 17, whereas the curvature of the Ipad-Vpad graph 30 is large with lower values of Vgs 17. This curvature is interchangeably referred to hereinbelow as "MOS linear region impedance curvature," or "MOS linear region curvature," "linear region curvature," or simply "impedance curvature." It is known that the slope of an Ipad-Vpad curve gives the reciprocal of Rpad. Thus, because of the MOS linear region curvature, the values of Rpad are not the sane or controlled for graphs 28 and 30.

Although the series resistor Rs 22 forces the NMOS transistor M1 to be in its linear region, for this technique of impedance (Rpad) control to work, it is usually assumed that Vgs is at its maximum value (e.g., at supply voltage Vdd in an NMOS device) and that the PVT (Process Voltage Temperature) variation of Rs 22 is relatively small (at least with respect to the PVT impedance variation of transistor M1). The gate-to-source voltage Vgs 17 must normally be at its maximum possible value (for transistor M1 linear region operation) to minimize the impedance curvature of transistor M1 (as, for example, in the graph 28 in FIG. 2) because of the changing Vds as the pad voltage Vpad 26 changes (due to, for example, fluctuations in the operating characteristics of another device or circuit stage connected to the MOS driver circuit 12 through the IC pad 24 or presence of a "return wave front" from such device operating as a signal receiving device).

The effect of PVT spread of the internal linearizing resistor Rs 22 may be illustrated in the case of a USB1.1 buffer within a USB2.0 PHY as follows. In a 0.11 μm embedded CMOS fabrication technology, the value of Rs 22 will spread by as much as 45% from its nominal value over PVT. Thus, for example, if the nominal value (at 0° C.) of Rs=28 Ohms, then it will actually PT spread between about 22 Ohms and 35 Ohms. The problem is the lower 22 Ohm limit because it means that, for a 45 Ohm overall impedance requirement (as discussed hereinbefore with reference to FIG. 1), the linear region of MOS transistor M1 (14) has to make up greater than 50% of that total impedance (or 45 Ohms). Such a high impedance requirement from transistor M1 (14) during its linear region of operation may create an impedance curvature of as much as several Ohms over the 1.1V range of the USB2.0 specification (discussed hereinabove with reference to FIG. 1). If one chooses Rs 22 much higher than 28 Ohms, then the dimensions (W/L) of transistor M1 (14) would be unrealistically huge as can be seen from equations (1) and (2). An external precision resistor (not shown) of high value may be used (as discussed hereinbelow) to maintain the smaller size of M1, but there would still be some linear region curvature (in the Ipad-Vpad graph) and also a need for extra pads (for external precision resistor).

A problem with the current precision resistor approach is that many non-analog CMOS fabrication processes do not have precision resistors available. In such processes, it may not be possible to meet a tight impedance specification with the circuit of FIG. 2. In such processes, some additional form of PVT impedance trimming is usually necessary. At present, three basic solutions (or mixtures of them) exist to control pad impedance within a tight percentage spread.

In the first approach, an external series precision resistor Rs (not shown) is used with essentially no PVT variation. The external resistor is not fabricated along with the MOS transistor M1 (14), but rather externally attached to the IC pad 24 in series with transistor M1 when needed. In this configuration, the internal resistor 22 may be absent from the MOS driver circuit 12. If such an external resistor Rs is made large enough, then one can effectively compensate for large PVT variations in the impedance of transistor M1. Unfortunately, there are some disadvantages with this technique: (1) This technique requires external components and increases system cost and component count. (2) This technique may require more I/O pads (e.g., in case of using such technique for a USB1.1 buffer in a USB2.0 PHY device). (3) Even with an external precision resistor, it may not be possible to meet a tight low impedance specification (e.g., under USB2.0 as discussed above with reference to FIG. 1) because of the need to make transistor M1 inordinately large in size (as can be seen from equations (1) and (2) above).

In the second approach, a "digital" (or "discrete") impedance trimming technique is used. In this technique, transistor M1 (14) may comprise of a number of NMOS "fingers," the "correct" number of fingers being activated for any given PVT corner. The advantage of this technique is that Vgs 17 can be kept constant, normally at its maximum possible value (e.g., supply voltage Vdd (not shown)), to minimize the curvature in the linear region impedance of transistor M1 (14). However, the disadvantages of this digital calibration technique are: (1) When it is not possible to drive Vgs to a high value (>>Vds(max) in the Vpad region of interest), then the linear region impedance curvature of transistor M1 (14) can still be very significant. When one takes into account comparator offsets and reference voltage offsets (in the trimming circuit realization), then a tight impedance specification may not be realizable. (2) In this technique, a whole replica pad driver is required for comparison with some reference precision resistor (or current derived from such a precision resistor). This is a waste of silicon area, for example, in a USB2.0 PHY device that needs just two impedance controlled IC pads. The addition of an entire third pad for just impedance control may not be desirable. (3) It is not clear under this technique when one needs to update the impedance (i.e., change the number of NMOS "fingers"). Impedance updating may not be done safely during data transmission because it could cause major discontinuities in the rise/fall in voltage/current characteristics of the transmitting pad. This may cause the overall system to fail. Therefore, the impedance needs to be updated at a time when there is no active data transmission (or data reception, if the pad is being used as a termination resistance as, for example, in the USB2.0 HS mode). However, there may be no clear "gap" in the transmission protocol and, hence, choosing such "update gap" may pause an additional problem for the system designer. Such "update gaps" may be defined in the data protocol; however, that is not the case for USB2.0. The USB2.0 system designer may have to spend time and resource to figure out such "safe gaps" during which impedance may be updated.

In the third approach, an "analog" impedance trimming technique is used. This technique essentially solves many of the problems associated with the digital trimming technique described above. The advantage of the analog trimming technique are: (1) A "fraction" or "scaled version" of the pad cell (i.e., a scaled replica pad driver) can be used for impedance trimming. This saves on silicon area. (2) The trimming process is continuous; thus, one does not need a clear "update" gap in the transmission protocol as with the digital solution. However, the disadvantages of the classical analog solution are: (1) Similar to digital trimming, the analog approach trims the pad impedance for one value of Vpad only. This means that the linear region MOS impedance curvature is not trimmed out for a range of Vpad values. (2) The use of a properly-biased, scaled replica pad may require very tight control of voltage and current references because of the existence of MOS linear region impedance curvature. (3) The Vgs of transistor M1 (14) cannot be kept constant, at its maximum possible value, to minimize linear region impedance curvature. With a fixed size for transistor M1, Vgs 17 will be maximized for the slow process corner (slow process, maximum temperature, minimum supply voltage Vdd, largest internal linearizing resistor Rs value) and, thus, the impedance curvature is minimized for this worst case corner only. For the fast process corner (fast process, minimum temperature, maximum Vdd, smallest Rs value), however, the Vgs 17 will have to be much lower than maximum, resulting in the worst linear region impedance curvature (e.g., as shown in graph 30 in FIG. 2). If the PVT change in Rs 22 is large, then the classic analog solution fails to trim pad impedance to within a tight percentage tolerance.

Therefore, it is desirable to devise an analog solution (given its many advantages in terms of, for example, reduced complexity and conservation of silicon area) to trim out the MOS linear region impedance curvature while accommodating PVT spreads in values of internal or external precision resistors. It is further desirable to maintain a linear impedance for a range of Vpad values, while also maintaining the Vgs at its maximum possible value to obtain greater linearity.

SUMMARY

In one embodiment, the present disclosure contemplates a method of correcting impedance curvature in a MOS driver circuit. The method comprises using a first MOS transistor and second MOS transistor as part of the MOS driver circuit; and operating the first MOS transistor and the second MOS transistor so as to compensate for changes in output impedance of the first MOS transistor through corresponding changes in output impedance of the second MOS transistor.

In another embodiment, the present disclosure contemplates a method of correcting impedance curvature in a MOS driver circuit. The method comprises using a first MOS transistor and second MOS transistor as part of the MOS driver circuit; and operating the first MOS transistor and the second MOS transistor so as to increase output impedance of the second MOS transistor when output impedance of the first MOS transistor decreases, and vice versa.

In an alternative embodiment, the present disclosure contemplates a method of correcting impedance curvature in a MOS driver circuit. The method comprises using a first MOS transistor and second MOS transistor as part of the MOS driver circuit; using a signal adder circuit as part of the MOS driver circuit; maintaining a controlled voltage at a first input terminal of the first MOS transistor; using the signal adder circuit to provide a differential voltage at a second input terminal of the second MOS transistor; and operating the first MOS transistor and the second MOS transistor so as to compensate for changes in output impedance of the first MOS transistor through corresponding changes in output impedance of the second MOS transistor.

In a further embodiment, the present disclosure contemplates a method of correcting impedance curvature in a MOS driver circuit. The method comprises using a first MOS transistor and second MOS transistor as part of the MOS driver circuit; using a signal adder circuit as part of the MOS driver circuit; maintaining a controlled voltage at a first input terminal of the first MOS transistor; using the signal adder circuit to provide a differential voltage at a second input terminal of the second MOS transistor; and operating the first MOS transistor and the second MOS transistor so as to increase output impedance of the second MOS transistor when output impedance of the first MOS transistor decreases, and vice versa.

In another embodiment, the present disclosure contemplates a MOS driver circuit that comprises a first MOS transistor configured to receive a controlled voltage at a first input terminal thereof; and a second MOS transistor coupled to the first MOS transistor and configured to receive a differential voltage at a second input terminal thereof, wherein the second MOS transistor is configured to have an increased output impedance when output impedance of the first MOS transistor decreases, and vice versa.

In a still further embodiment, the present disclosure contemplates a MOS driver circuit that comprises a first MOS transistor configured to receive a controlled voltage at a first input terminal thereof; and a second MOS transistor coupled to the first MOS transistor and configured to receive a differential voltage at a second input terminal thereof, wherein the second MOS transistor is configured to compensate for changes in output impedance of the first MOS transistor through corresponding changes in output impedance of the second MOS transistor.

The present disclosure further contemplates a MOS driver circuit that comprises a first MOS transistor configured to receive a controlled voltage at a first input terminal thereof; and a second MOS transistor coupled to the first MOS transistor and configured to receive a differential voltage at a second input terminal thereof, wherein the second MOS transistor is configured to have an increased output impedance when output impedance of the first MOS transistor decreases, and vice versa; a signal adder circuit coupled to the first and the second MOS transistors, wherein an output of the signal adder circuit is coupled to the second input terminal to provide the differential voltage to the second MOS transistor, and wherein a first output terminal of the first MOS transistor is coupled to a first input of the signal adder circuit to provide a first input voltage thereto; a scaled replica of the MOS driver circuit having an output coupled to a second input of the signal adder circuit to provide a second input voltage thereto; and a linearizing resistor coupled in series with the first output terminal of the first MOS transistor and a second output terminal of the second MOS transistor.

The present disclosure still further contemplates a MOS driver circuit that comprises a first MOS transistor configured to receive a controlled voltage at a first input terminal thereof; a second MOS transistor coupled to the first MOS transistor and configured to receive a differential voltage at a second input terminal thereof, wherein the second MOS transistor is configured to compensate for changes in output impedance of the first MOS transistor through corresponding changes in output impedance of the second MOS transistor; a signal adder circuit coupled to the first and the second MOS transistors, wherein an output of the signal adder circuit is coupled to the second input terminal to provide the differential voltage to the second MOS transistor, and wherein a first output terminal of the first MOS transistor is coupled to a first input of the signal adder circuit to provide a first input voltage thereto; a scaled replica of the MOS driver circuit having an output coupled to a second input of the signal adder circuit to provide a second input voltage thereto; and a linearizing resistor coupled in series with the first output terminal of the first MOS transistor and a second output terminal of the second MOS transistor.

In a further embodiment, the present disclosure contemplates a method of operating a MOS driver circuit. The method comprises using a first MOS transistor with a first terminal, a second terminal, and a third terminal; using a second MOS transistor with a fourth terminal, a fifth terminal, and a sixth terminal; providing a DC supply voltage to the first and the fourth terminals; further providing a reference potential to the second and the fifth terminals; and further using an internal linearizing resistor and an external precision resistor in series with the third and the sixth terminals.

In a still further embodiment, the present disclosure contemplates a system that comprises a processor; a memory controller; a memory device; a first bus interconnecting the processor and the memory controller; and a second bus interconnecting the memory controller and the memory device, wherein at least one of the processor, the memory controller, and the memory device includes a MOS driver circuit. The MOS driver circuit comprises a first MOS transistor configured to receive a controlled voltage at a first input terminal thereof, and a second MOS transistor coupled to the first MOS transistor and configured to receive a differential voltage at a second input terminal thereof, wherein the second MOS transistor is configured to compensate for changes in output impedance of the first MOS transistor through corresponding changes in output impedance of the second MOS transistor.

The present disclosure also contemplates a system that comprises a data processing unit; an input device connected to the data processing unit; an output device connected to the data processing unit; and a data storage device connected to the data processing unit. The data processing unit includes a processor, a memory controller, a memory device, a first bus interconnecting the processor and the memory controller, and a second bus interconnecting the memory controller and the memory device. At least one of the processor, the memory controller, the memory device, the input device, the output device, and the data storage device includes a MOS driver circuit, which comprises a first MOS transistor configured to receive a controlled voltage at a first input terminal thereof, and a second MOS transistor coupled to the first MOS transistor and configured to receive a differential voltage at a second input terminal thereof, wherein the second MOS transistor is configured to have an increased output impedance when output impedance of the first MOS transistor decreases, and vice versa.

The present disclosure describes a system and method to correct or cancel MOS linear region impedance curvature. The linear region curvature correction may be obtained by using two MOS transistors in the pad driver/buffer and operating the transistors so as to proportionately increase output impedance of one of the transistors when the output impedance of the other decreases, and vice versa. A linear pad impedance may be maintained over a range of Vpad values, while also maintaining the Vgs supplied to pad driver transistors at its maximum possible value to obtain greater linearity. The approach of the present disclosure relaxes the requirements on the voltage/current references used in the MOS pad drivers and makes tight impedance control possible, especially in a situation where the MOS fabrication process (typically all currently used processes) does not have available an internal precision resistor with reasonably well controlled value. Thus, PVT spreads in values of internal or external precision resistors are also accommodated in a MOS driver circuit built according to the teachings of the present disclosure.

BRIEF DESCRIPTION OF THE DRAWINGS

For the present disclosure to be easily understood and readily practiced, the present disclosure will now be described for purposes of illustration and not limitation, in connection with the following figures, wherein:

FIGS. 14A-14C illustrate three diagrams showing plots of voltages and currents (versus time) at various terminals or points in the MOS driver circuit in FIG. 12 when the circuit is SPICE simulated in the fast (FF) corner, with rising edge for Vpad;

FIGS. 15A and 15B illustrate slow (SS) corner results of SPICE simulation of the MOS driver circuit in FIG. 4 in the HS mode;

DETAILED DESCRIPTION

Reference will now be made in detail to certain embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical pad drivers or buffers. It is noted at the outset that the terms "connected", "coupled," "connecting," "electrically connected," etc., are used interchangeably herein to generally refer to the condition of being electrically connected. Further, a terminal is considered "held" at a specific potential when appropriate voltage (e.g., ground potential, reference voltage, supply voltage, etc.) is available at that terminal. The terms "supply" or "provide" are also used interchangeably to refer to electrically supplying or providing a voltage or current to a circuit element or terminal.

It is further noted at the outset that the term "MOS", as used herein, includes a wide range of semiconductor devices. Some of the MOS devices (e.g., transistors) may have at least three terminals, whereas some other MOS devices (e.g., resistors or diodes) may have less than three terminals. In one embodiment, these devices are fabricated using a CMOS (complementary MOS) fabrication technology. A MOS device can include, for example, a Field Effect Transistor (FET), a dynamic-threshold MOS transistor (DT-MOST), or a BICMOS (bipolar CMOS) device. The FET can be a Metal Oxide Semiconductor FET (MOSFET), a Junction FET (JFET), or a Metal Semiconductor FET (MESFET). A "three terminal device" can include devices with three or more terminals. For example, a three terminal device can be an FET with a fourth terminal (a bulk, backgate or substrate electrode) coupled to a voltage potential. In one embodiment, the bulk electrode, when used, is coupled to a ground potential or to the source electrode for an n-channel MOSFET (or NMOS), or to the source electrode or the positive supply rail for a p-channel MOSFET (or PMOS) as will be evident from the circuit diagrams.

Figure 2:
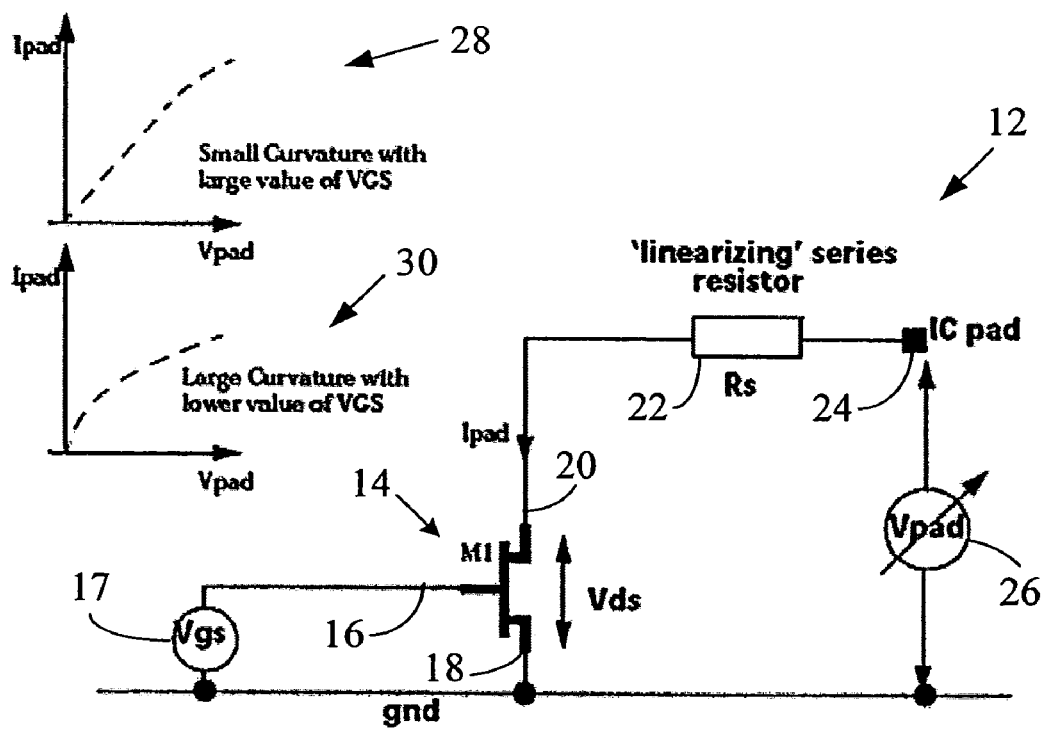
FIG. 2 illustrates a general approach to pad impedance control in a MOS driver circuit.
Figure 3:
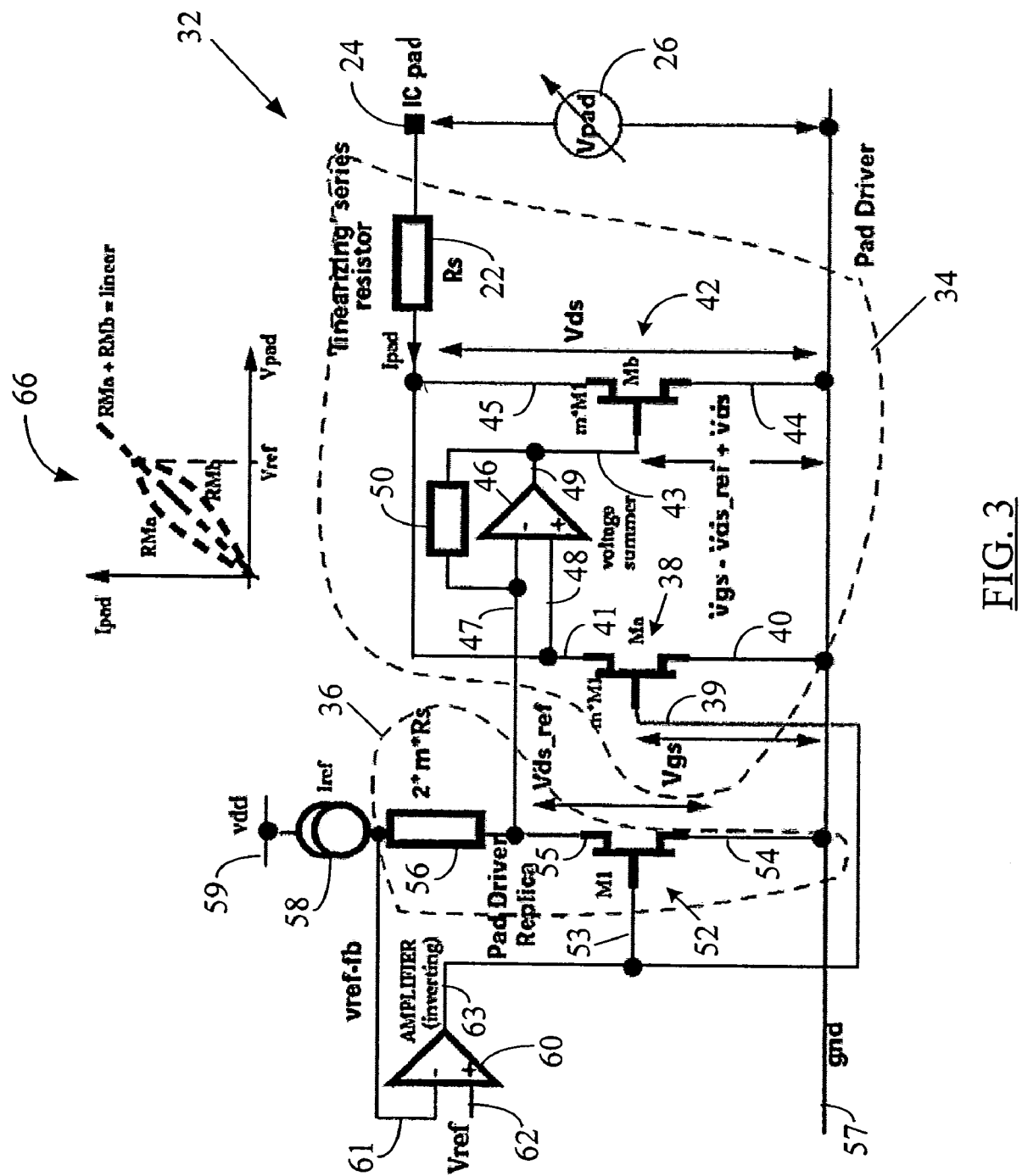
FIG. 3 illustrates an exemplary MOS driver circuit for trimming MOS linear region impedance curvature according to one embodiment of the present disclosure.

FIG. 3 illustrates an exemplary MOS driver circuit 32 for trimming MOS linear region impedance curvature according to one embodiment of the present disclosure. The MOS driver circuit 32 uses analog impedance trimming techniques and may be used in place of the conventional MOS driver circuit 12 (FIG. 2) to obtain linear pad resistance (Rpad) as discussed hereinbelow. It is noted here that the terms "impedance" and "resistance" are generally used interchangeably herein, unless otherwise specified. The MOS driver circuit 32 may comprise a pad driver 34 and a pad driver replica 36, which may be a scaled replica (as is illustrated, for example, in FIG. 4 discussed later). Various circuit connections in the driver circuit 32 are self-explanatory and, hence, are very briefly described herein.

The pad driver 34 may include two NMOS transistors Ma 38 and Mb 42 with their respective source terminals 40, 44 held at a common circuit potential (e.g., the circuit ground), and their respective drain terminals 41, 45 connected to each other and also in series with the internal linearizing resistor Rs 22. A controlled voltage Vgs is maintained at the gate terminal 39 of the transistor Ma 38 (via an amplifier 60 discussed later below), whereas a differential voltage (Vds–Vds_ref) is provided to the gate terminal 43 of the transistor Mb 42 via a voltage adder or summer circuit 46 discussed below. In one embodiment, the signal adder circuit 46 is an operational (differential) amplifier with non-inverting input 48 connected to the drain terminal 41 of transistor Ma 38 and inverting input 47 connected to the drain terminal of transistor M1 (52) in the pad driver replica 36 as shown. The output 49 of the voltage summer 46 may be connected to the gate 43 of transistor Mb 43 to supply the differential voltage at the gate 43. A suitable feedback load 50 may be placed between the output 49 and inverting input 47 of the op-amp 46 as shown. The pad driver circuit 34 is connected to the IC pad 24, which allows coupling with other circuit elements (not shown) during operation of a system. The presence of the pad voltage Vpad 26 is also indicated in FIG. 3.

The pad driver replica 36 may include an NMOS transistor M1 (52) having a source terminal 54 connected to the circuit ground, a gate terminal 53 connected to an output 63 of an inverting amplifier 60, and a drain terminal 55 connected to a current reference source 58 and a positive supply voltage Vdd 59 via a series resistor 56. In the embodiment of FIG. 3, the value of the series resistor 56 is chosen to be 2 m times the values of the internal linearizing resistor Rs 22, where "m" is a number equivalent to the number of transistors M1 (52) (i.e., the NMOS "fingers") connected in parallel to make up the pad driver transistors Ma 38 and Mb 42 as is indicated in FIG. 3. For example, in the embodiment of FIG. 4, the value of m=18 (i.e., the number of "fingers"=18) as can be seen from the pad driver circuit portion in FIG. 4 (only the value of "m" is given in FIG. 4, without depicting all 18 fingers).

The MOS driver circuit 32 may also include an amplifier 60 configured to maintain the controlled voltage Vgs at the gates of transistors M1 (52) and Ma 38 as is shown in FIG. 3. The amplifier 60 may be a differential amplifier operating in an inverting configuration with its output 63 connected to the gates 53 and 39, its inverting input 61 connected to the output of the current reference 58 (and, hence, also indirectly to the drain 55 of transistor M1) to receive appropriate portion of the supply voltage Vdd, and its non-inverting input 62 held at a predetermined reference potential Vref. The differential inverting amplifier 60 thus maintains a constant, steady potential Vgs at the gates of replica driver transistor M1 (52) and the pad driver transistor Ma 38. This allows the value of Vgs to be continually updated to maintain the impedance of M1 (52) and Ma 38 constant with PVT (process, voltage, temperature) variations. Thus, the amplifier 60 ensures that continuous analog trimming of Vgs is performed. The scaled impedance of the pad driver replica 36 may be exactly equal to that of the pad driver 34, only when the voltage of pad 24 is at Vref. However, in the event of pad voltage above and below Vref, the teachings of the present disclosure may be used to maintain impedance of the pad driver 34 near to that of the replica 36 (which is held constantly at Vref).

In the embodiment of FIG. 3, the voltage appearing at the inverting input 61 of the amplifier 63 is denoted as Vref_fb (the feedback portion of the reference voltage Vref), the voltage between the drain terminal 55 of transistor M1 (52) and the ground potential 57 is denoted as Vds_ref (which is also an input to the voltage summer 46), the identical voltages at the gate terminals 53, 39 of transistors M1 (52) and Ma 38 respectively are commonly denoted as Vgs, and the voltage between the drain and source terminals of transistor Mb 42 is denoted as Vds. It is observed that as the drains of transistors Ma and Mb are connected, the same voltage Vds is also present between the drain 41 and source 40 of transistor Ma. Further, as the drain of transistor Ma 38 is connected to the non-inverting input 48 of the op-amp 46, the op-amp 46 receives voltage Vds at its non-inverting input 48. Hence, the differential voltage at the output 49 of the op-amps 46 may be given as Vds–Vds_ref. If the gate-to-source voltage of transistor Mb 42 is denoted as Vgsb, then the effective voltage at the gate terminal 43 of transistor Mb 42 may be given as Vgsb=Vgs–Vds_ref+Vds, which includes a differential voltage component (Vds–Vds_ref) as can be seen from the discussion herein. The voltage Vgsb will be equal to Vgs only when the voltage at the IC pad 24 is exactly equal to Vds_ref, because, in that event, the non-inverting input of the op-amp 46 will be at Vds_ref.

Assuming proper biasing of all circuit elements in FIG. 3, in operation, the amplifier 60 sets the correct (desired) Vgs for M1 (52) (and, hence, for Ma 38) such that Vref_fb is at the same potential as Vref. In one embodiment, Vref=1.1V. When the voltage on the IC pad 24 (i.e., Vpad 26) is driven to Vref (i.e., Vpad=Vref), the value of Ipad equals to 2*m*Iref. Hence, the differential voltage output 49 of the adder circuit 46 is zero and, therefore, the gate voltages of transistors Ma 38 and Mb 42 become identical (=Vgs). On the other hand, when the voltage on the IC pad 24 is driven below Vref (i.e., Vpad<Vref), the resistance RMa (not shown) (i.e., impedance of transistor Ma 38) reduces with reducing Vds, which reduces with reducing Vpad (because Vds=Vpad−Ipad*Rs). However, the resistance RMb (not shown) (i.e., impedance of transistor Mb 42) increases with reducing Vds by an amount exactly equal to the reduction in RMa. Therefore, the net effect is a linear pad resistance as can be seen from the combined linear region Ipad-Vpad graph 66 for the pad driver 32 with MOS transistors Ma 38 and Mb 42. The linearity is thus maintained for Vpad values less than or equal to the reference voltage Vref The following equations further explain why RMb increases by the same rate as RMa is decreasing.

It is seen from equation (1) that, in general, the resistance for MOS in the linear region can be given by:

$$R_{MOS} = \frac{1}{\beta\left(V_{gs} - V_T - \frac{V_{ds}}{2}\right)} \quad (3)$$

All the parameters in equation (3) are explained before with reference to equations (1) and (2). Based on the general equation (3) and various voltages shown in FIG. 3, the values of RMa and RMb can be given as:

$$R_{Ma} = \frac{1}{\beta\left(V_{gs} - V_T - \frac{V_{ds}}{2}\right)} \quad (4)$$

$$R_{Mb} = \frac{1}{\beta\left([V_{gs} - V_{ds\_ref} + V_{ds}] - V_T - \frac{V_{ds}}{2}\right)} \quad (5)$$

$$= \frac{1}{\beta\left(V_{gs} - V_{ds\_ref} - V_T + \frac{V_{ds}}{2}\right)}$$

It can be seen from equations (4) and (5) that the value of RMa decreases as Vds goes lower than Vds_ref, but the value of RMb increases by the same rate (as RMa is decreasing) when Vds goes below Vds_ref. Therefore, the combined effective resistance of RMa and RMb is linear over a range of Vpad values as can be seen from the Ipad-Vpad graph 66 in FIG. 3.

On the other hand, the vice versa is also true. That is, when the voltage on the IC pad 24 is driven above Vref (i.e., Vpad>Vref), the resistance RMa (not shown) increases with increasing Vds, but the resistance RMb (not shown) decreases with increasing Vds by an amount exactly equal to the reduction in RMa. Therefore, the net effect is a linear pad resistance similar to that illustrated in the graph 66, but with curves of RMa and RMb reversed (not shown in FIG. 3). Thus, the linearity may also be maintained for Vpad values greater than the reference voltage Vref. It is noted, however, that Vpad may not be greater than Vref in USB2.0 circuits.

A "pad" or "integrated circuit pad" (defined hereinbefore) may be used for inter-system communication, for example, via a cable of controlled characteristic impedance. It is important, in such an environment, to tightly control transmitter and receiver pad impedances, in order to avoid multiple signal reflections. Therefore, the transmitting IC pad (having the impedance control according to the methodology of the present disclosure) may connect to a terminating receiver pad, which may be within the same IC or in another external IC. This connection may be direct, via a cable (possibly with intermediate passive components, like series resistors or inductors), or via any other suitable manner to avoid multiple signal reflections.

Many possible architectures may exist for the voltage summer circuit 46 if only the DC resistance (Rpad_dc) of the IC pad 24 is of concern. In case of a USB1.1 buffer with the MOS driver circuit 32, for example, the pad impedance (Rpad) should be within USB1.1 specification when the pad is subjected to a return wave-front from an unterminated receiver (not shown) connected to the IC pad 24. In one embodiment, the transmitted wave slew rate may be set so as to achieve a rise/fall time of 20 ns or less for the return wave-front. To achieve such high-speed switching with desired Rpad, the summer circuit 46 may be designed as a voltage follower circuit as is illustrated, for example, in FIGS. 4, 9 and 12.

First Circuit Realization of FIG. 3

Figure 4:
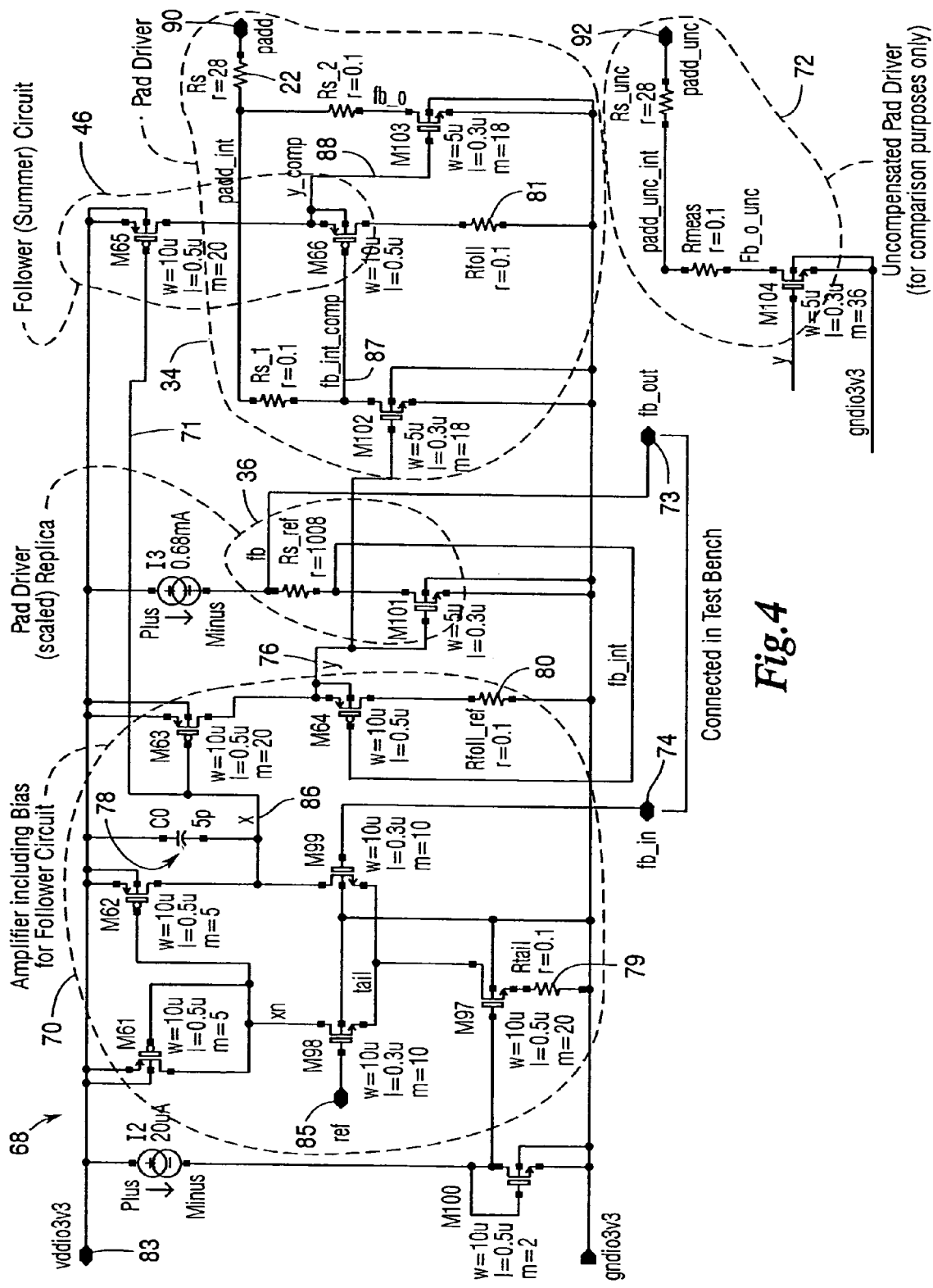
FIG. 4 is an exemplary schematic of a practical realization of the MOS driver circuit in FIG. 3 according to one embodiment of the present disclosure.

FIG. 4 is an exemplary schematic of a practical realization of the MOS driver circuit 32 in FIG. 3 according to one embodiment of the present disclosure. The "compensated" pad driver circuit (or MOS driver circuit) 68 in FIG. 4 is shown along with a conventional "uncompensated" pad driver 72 (similar to the driver circuit 12 in FIG. 2) just for comparison purpose. As FIG. 4 is a realization of the general circuit configuration in FIG. 3, the circuit blocks having similar functions in FIGS. 3 and 4 are denoted by the same reference numerals without assigning reference numerals to each circuit component in FIG. 4 (e.g., resistor, transistor, capacitor, etc.). Further, as the function of the circuit in FIG. 4 can be easily explained when a comparison of FIGS. 3 and 4 is made, a detailed description of the circuit components in FIG. 4 is omitted here for the sake of brevity. From a comparison of FIGS. 3 and 4, it is seen that the MOS driver circuit 68 in FIG. 4 includes the pad driver 34, the scaled replica of the pad driver 36, the voltage summer circuit 46 (implemented in a voltage follower configuration) and an amplifier 70. The amplifier 70 is substantially similar to the amplifier 60 in FIG. 3, except that the amplifier 70 is configured to provide a bias for the follower circuit 46 instead of a direct drain connection (connecting drain 55 with the inverting input 47) in FIG. 3. The follower bias line is indicated by the reference numeral 71. It is observed that the Vref_fb signal is provided to the amplifier 70 when the test pads 73 and 74 are connected. Despite some implementational variations, the driver circuit 68 in FIG. 4 is functionally equivalent to the circuit 32 in FIG. 3.

Some points to note about the MOS driver circuit 68 of FIG. 4 are: (1) A voltage follower circuit is included at the output of the amplifier 70 so as to automatically generate the correct bias for the voltage summer circuit 46 (also implemented as a voltage follower) in the pad driver 34. Thus, the amplifier 70 includes a differential amplifier and a voltage follower. (2) Ideally, one would want the heavy capacitive load on node 'y' (designated by reference numeral "76" in FIG. 4) to compensate the amplifier 70. In order to make node 'y' the dominant pole, one could use MOS diode connections for both PMOS loads (transistors M61 and M62 in FIG. 4) of the differential amplifier in the amplifier 70. However, then there may not be enough overall voltage gain for the amplifier 70 and the input offset voltage (for the amplifier 70) may be too large (creating unacceptable errors in the output impedance of the MOS driver circuit 68). (3) The 5 pF compensation capacitor C0 (78) may be dramatically reduced in value (or even eliminated) if self-biased cascode stages were used for the PMOS loads of the differential amplifier. (4) The 0.1 Ohm resistors 79-81 are used to facilitate current measurement for SPICE simulations. They are not 'real' resistors in the sense that they may not be part of the final circuit as fabricated. (5) As noted before, the uncompensated pad connection 72 is included in FIG. 4 for simulation comparison purposes only. (6) There may be a relatively large change in the follower bias current (i.e., large changes in the current in MOS transistors M65 and M66) between the slow corner case (largest bias current) and the best corner case (smallest bias current). This may be desirable because the increased bias current in the slow corner may compensate for increased NMOS gate capacitance of transistor M103. The percentage change may be, however, much more than necessary to compensate for increased capacitance. (7) Because the output of the differential amplifier (in amplifier 70) may not drive down near to 0V, the top PMOS (transistor M63) of the follower circuit (in amplifier 70) may have to be larger than it would otherwise need to be. In this event, a two stage amplifier (with an inherent level shift, capable of driving near to 0V) may be a better solution as depicted, for example, in the embodiment of FIG. 12. (8) The number of NMOS fingers (m=18, transistors M102 and M103) in the pad driver 34 are chosen to maximize the gate drive voltage (Vgs) in the slow corner (slow process, maximum temperature, minimum Vdd, largest Rs value). When the pad driver circuit 34 is then subjected to the fast corner (fast process, minimum temperature, maximum Vdd, smallest Rs value), the NMOS Vgs gate drive voltage will be as high as possible. Hence, such a scheme of maximizing Vgs voltage keeps the MOS linear region curvature to a minimum; however, it will not completely eliminate the curvature.

SPICE Simulation Results for the Circuit 68 of FIG. 4

Figure 1:
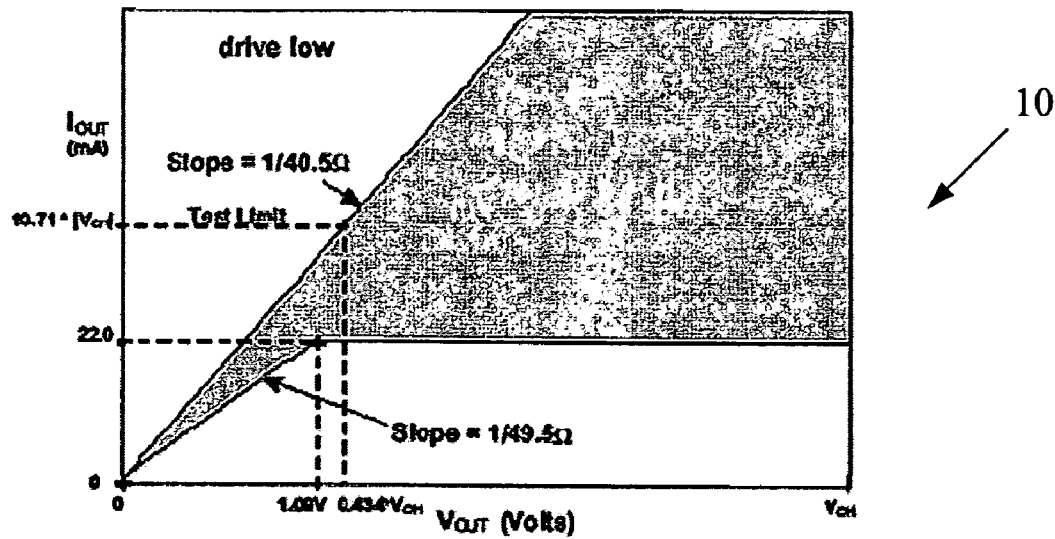
FIG. 1 illustrates an exemplary pad impedance specification under USB2.0 for a low impedance driver circuit.
Figure 5A:
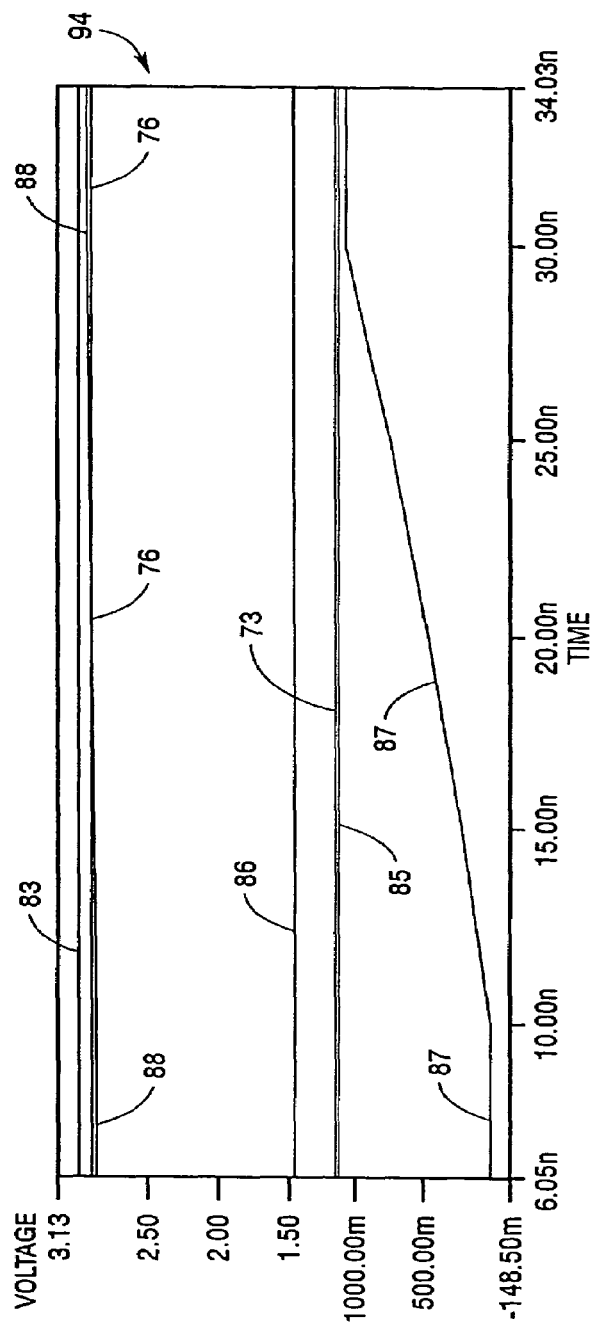
FIGS. 5A and 5B illustrate two diagrams showing plots of voltages and currents (versus time), respectively, at various terminals or points in the MOS driver circuit in FIG. 4 when the circuit is SPICE simulated in the slow SS corner, with rising edge for Vpad.
Figure 5B:
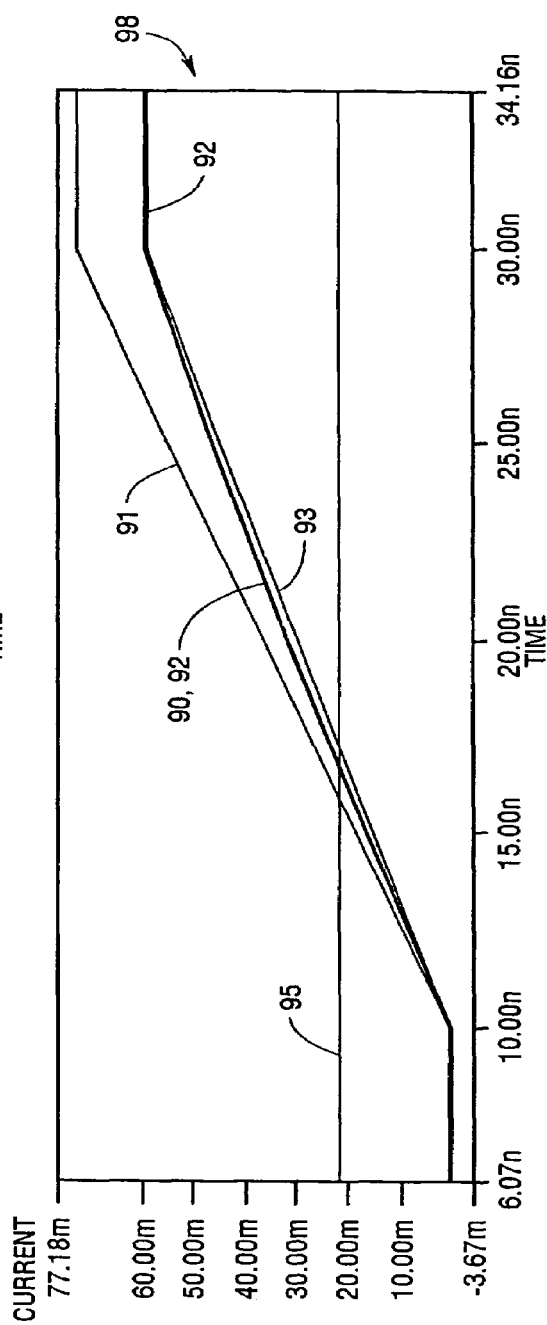

FIGS. 5A and 5B illustrate two diagrams 94, 98 showing plots of voltages and currents (versus time), respectively, at various terminals or points in the MOS driver circuit 68 in FIG. 4 when the circuit 68 is SPICE simulated in the slow SS corner, with rising edge for Vpad. The voltages in diagram 94 are measured in volts and mV, whereas the currents in diagram 98 are measured in mA. The time is given in nanoseconds in both diagrams. Various plots or graphs in the voltage diagram 94 are referenced by the same numerals as those used to identify corresponding test locations in the circuit in FIG. 4 where the voltage measurements are taken. For example, the voltage plot 86 corresponds to the voltage measurements taken at location 86 (the "x" signal line) in FIG. 4. Similarly, the voltage plot 87 corresponds to the voltage measurements taken at location 87 (the "fb_int_comp" line) in FIG. 4, and so on. In the same manner, the current diagram 98 includes a number of plots (except plots 91, 93, 95) bearing reference numerals corresponding to the locations of current measurements in FIG. 4. For example, the current graph 90 corresponds to the current measurements taken at the "padd" terminal 90 in FIG. 4 (similar to the IC pad 24 in FIG. 3), thereby taking the Rpad into account. Similarly, the current plot 92 corresponds to the current measurements taken at the "padd-unc" terminal 92 in FIG. 4, thereby taking the Rpad of the uncompensated driver 72 into account. It is noted that the plot 91 defines a current plot for an ideal resistance of 40.5 Ohms, the plot 93 defines a current plot for an ideal resistance of 49.5 Ohms, and the plot 95 defines an ideal current of 22 mA. These resistor values, 40.5 Ohms and 49.5 Ohms, respectively correspond to the lower and upper limits on the pad impedance values given in FIG. 1 for the USB2.0 impedance specification. The ideal current of 22 mA corresponds to the upper 49.5 Ohms limit when the pad voltage is 1.09V (~1.1V) as can be seen from FIG. 1. It is observed here that these ideal values are not part of the MOS driver circuit 68 in FIG. 4. These values are plotted in FIG. 5B so as to visualize whether a pad design is meeting the USB2.0 impedance specification.

It is seen from the voltage and current plots in FIGS. 5A-5B for the slow SS corner (worst for MOS drive capability) that the pad driver NMOS Vgs is maximized (>2.8V from a 3V supply) as can be seen from the plot 76. It is also seen from a comparison of current plots 90, 92 that there is no real discernible difference between the performance of curvature compensated and uncompensated pads in FIG. 4. Therefore, curvature compensation may not be needed in the slow (SS) corner case.

Figure 6A:
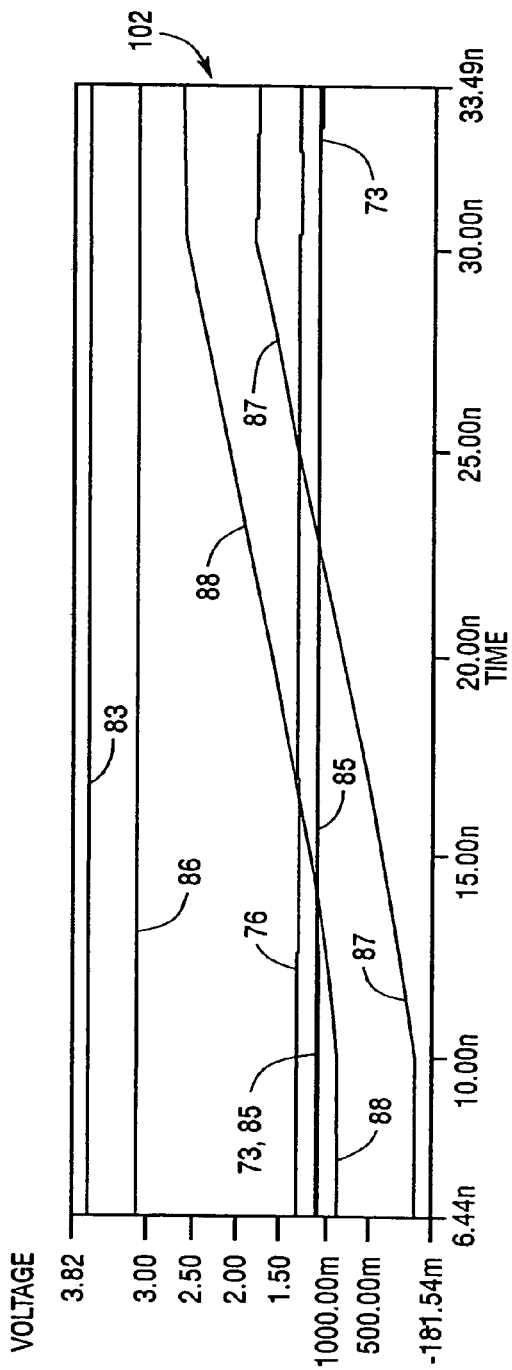
FIGS. 6A and 6B illustrate two diagrams showing plots of voltages and currents (versus time), respectively, at various terminals or points in the MOS driver circuit in FIG. 4 when the circuit is SPICE simulated in the fast (FF) corner, with rising edge for Vpad.
Figure 6B:
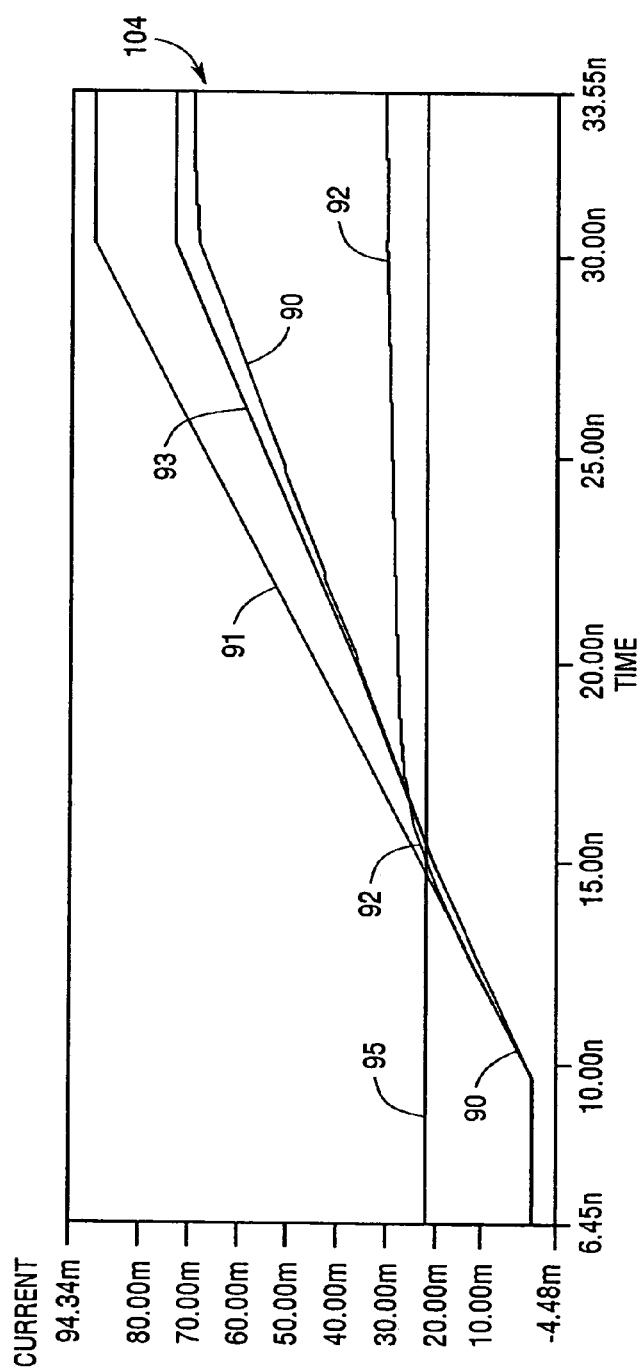

FIGS. 6A and 6B illustrate two diagrams 102, 104 showing plots of voltages and currents (versus time), respectively, at various terminals or points in the MOS driver circuit 68 in FIG. 4 when the circuit 68 is SPICE simulated in the fast (FF) corner, with rising edge for Vpad. The voltages in diagram 102 are measured in volts and mV, whereas the currents in diagram 104 are measured in mA. The time is given in nanoseconds in both diagrams. Various plots or graphs in the diagrams 102, 104 are referenced in the same manner (including the plots 91, 93, and 95 for ideal resistor and current values) as that described above with reference to FIGS. 5A-5B. Therefore, no additional explanation of various plots in FIGS. 6A-6B is provided. As can be seen from plot 76 in FIG. 6A, in the fast FF corner (best for MOS drive capability), pad driver NMOS Vgs has dropped to just 1.3V. This leads to several Ohms of linear region MOS impedance curvature. When one takes into account percentage errors in the generation of Vref and Iref, it may be difficult to meet the 45 Ohm +/– 10% impedance specification (under USB2.0 described before) using the uncompensated pad 72. It can be seen from a comparison of plots 90 and 92 that linear region curvature compensation is desirable in the fast (FF) corner case.

Figure 7A:
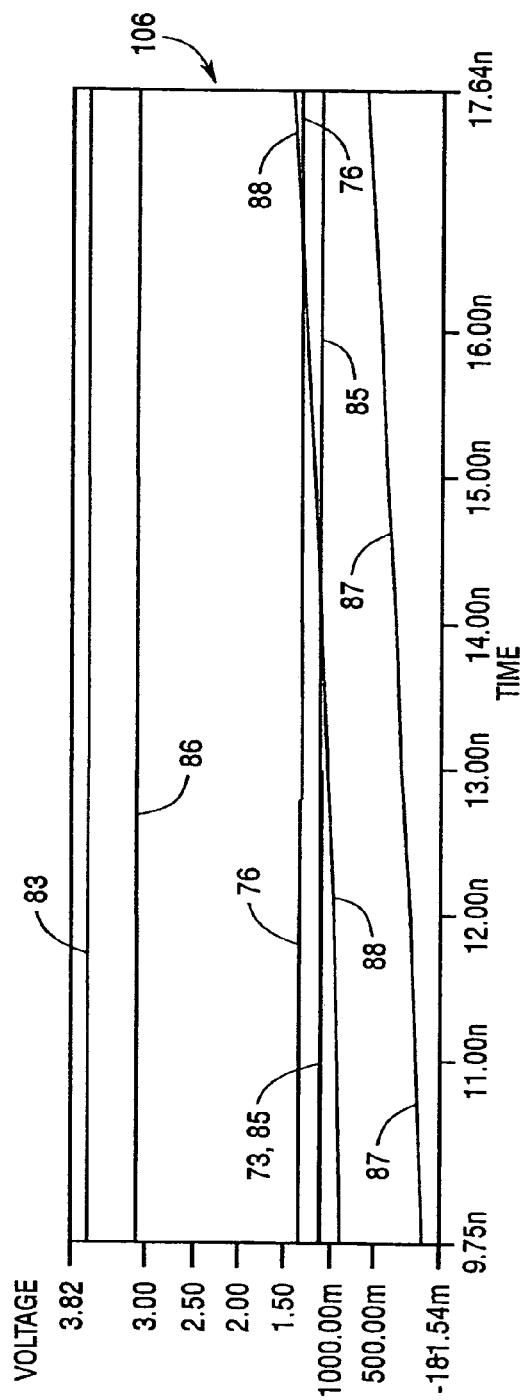
FIGS. 7A and 7B illustrate two diagrams showing zoomed (closer) versions of respective voltage and current plots in FIGS. 6A-6B.
Figure 7B:
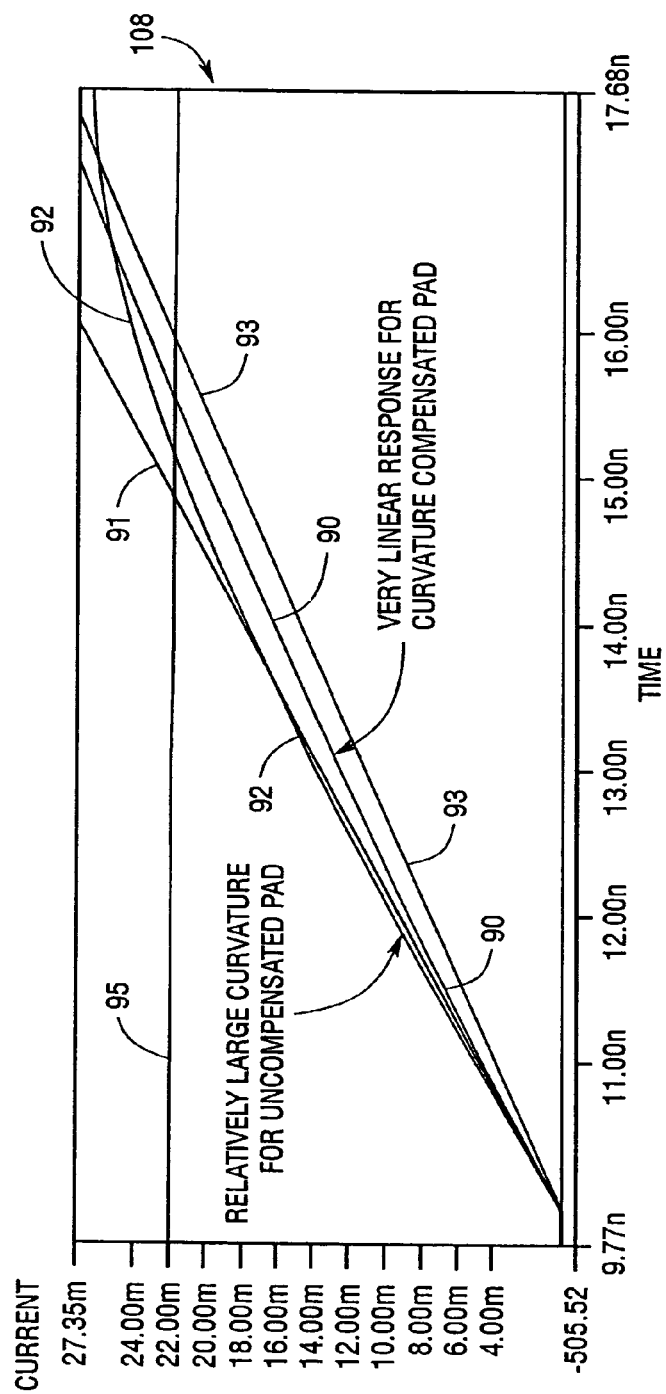

FIGS. 7A and 7B illustrate two diagrams 106, 108 showing zoomed (closer) versions of respective voltage and current plots 102, 104 in FIGS. 6A-6B. As before, the plots 106, 108 of voltages and currents (versus time), respectively, are obtained at various terminals or points in the MOS driver circuit 68 in FIG. 4 when the circuit 68 is SPICE simulated in the fast (FF) corner, with rising edge for Vpad. As FIGS. 7A-7B are zoomed versions of corresponding FIGS. 6A-6B, no additional explanation of graphs in FIGS. 7A-7B is provided. It is, however, observed from the diagram 108 that the compensated circuit 68 according to the present disclosure provides a very linear response (plot 90) as compared to the relatively large curvature (plot 92) for uncompensated driver circuit 72.

Figure 8A:
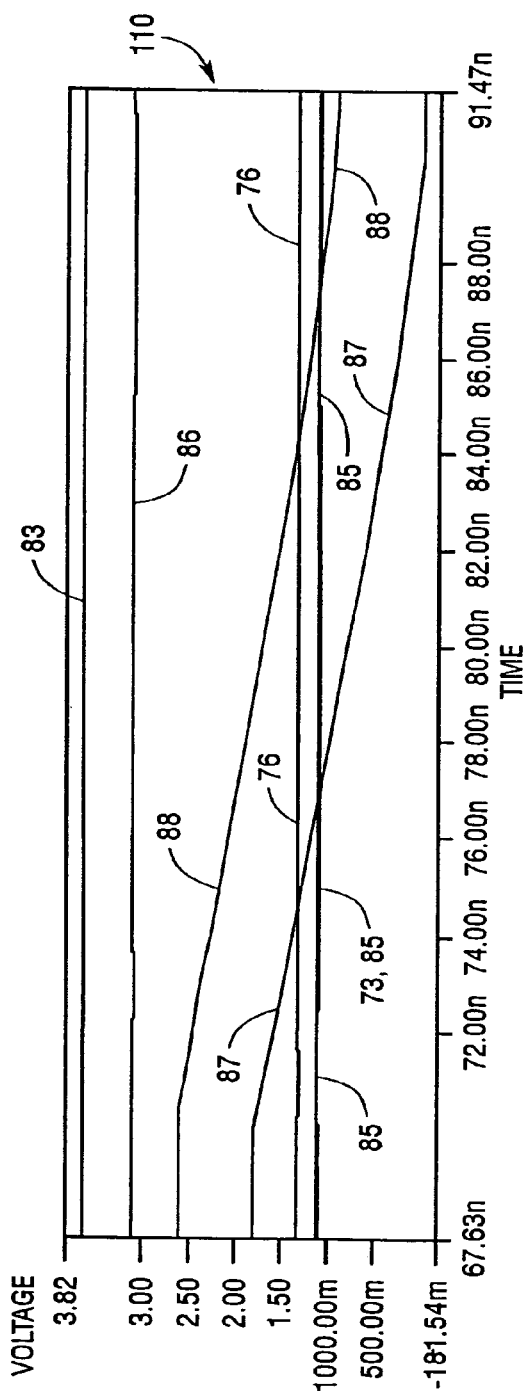
FIGS. 8A and 8B illustrate two diagrams showing plots of voltages and currents (versus time), respectively, at various terminals or points in the MOS driver circuit in FIG. 4 when the circuit is SPICE simulated in the fast (FF) corner, with falling edge for Vpad.
Figure 8B:
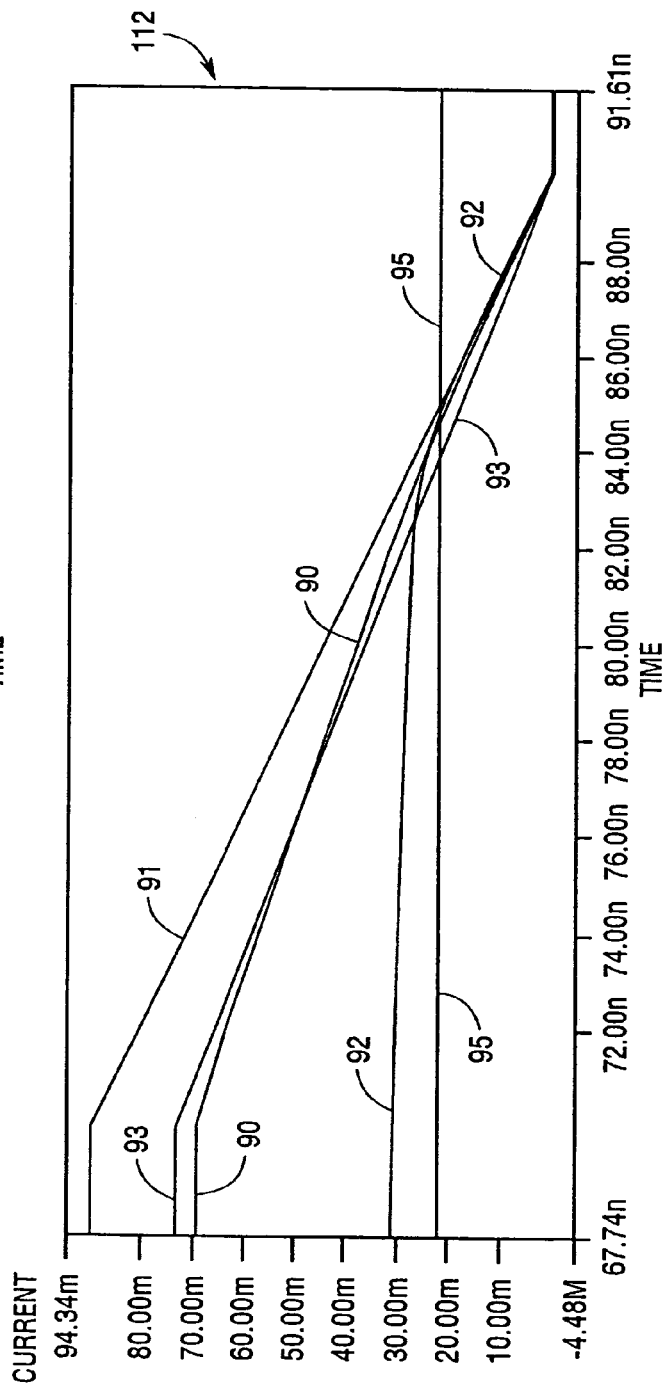

FIGS. 8A and 8B illustrate two diagrams 110, 112 showing plots of voltages and currents (versus time), respectively, at various terminals or points in the MOS driver circuit 68 in FIG. 4 when the circuit 68 is SPICE simulated in the fast (FF) corner, with falling edge for Vpad. The voltages in diagram 110 are measured in volts and mV, whereas the currents in diagram 112 are measured in mA. The time is given in nanoseconds in both diagrams. Various plots or graphs in the diagrams 110, 112 are referenced in the same manner as that described above with reference to FIGS. 5A-5B. Therefore, no additional discussion of various plots in FIGS. 8A-8B is provided.

It is noted that in various current graphs in FIGS. 5B, 6B, 7B, and 8B, the follower bias currents (in the MOS transistors M65 and M66 in FIG. 4) are not shown. These bias currents range from 120 µA for the best case corner to 1.3 mA for the worst case corner. In the embodiment of FIG. 4, because the switching is in the order of 10 mA plus during pad slew (for Vpad), such bias currents would be acceptable. In the slew rate limiting circuits (not shown in FIG. 4) of a USB1.1 buffer, a follower similar to the follower 46 in FIG. 4, with its high bias current, may also be needed. It is observed here that although the current source Iref 58 (FIG. 3) may preferably be an ideal current source, it may be replaced with a non-ideal, "real" current source without making any substantial difference to stability performance. The Vds of the real current source may be large (almost 2V in the worst case) and, therefore, the PMOS (not shown) forming the non-ideal current source can be relatively small and therefore low capacitive.

Second Circuit Realization of FIG. 3

Figure 9:
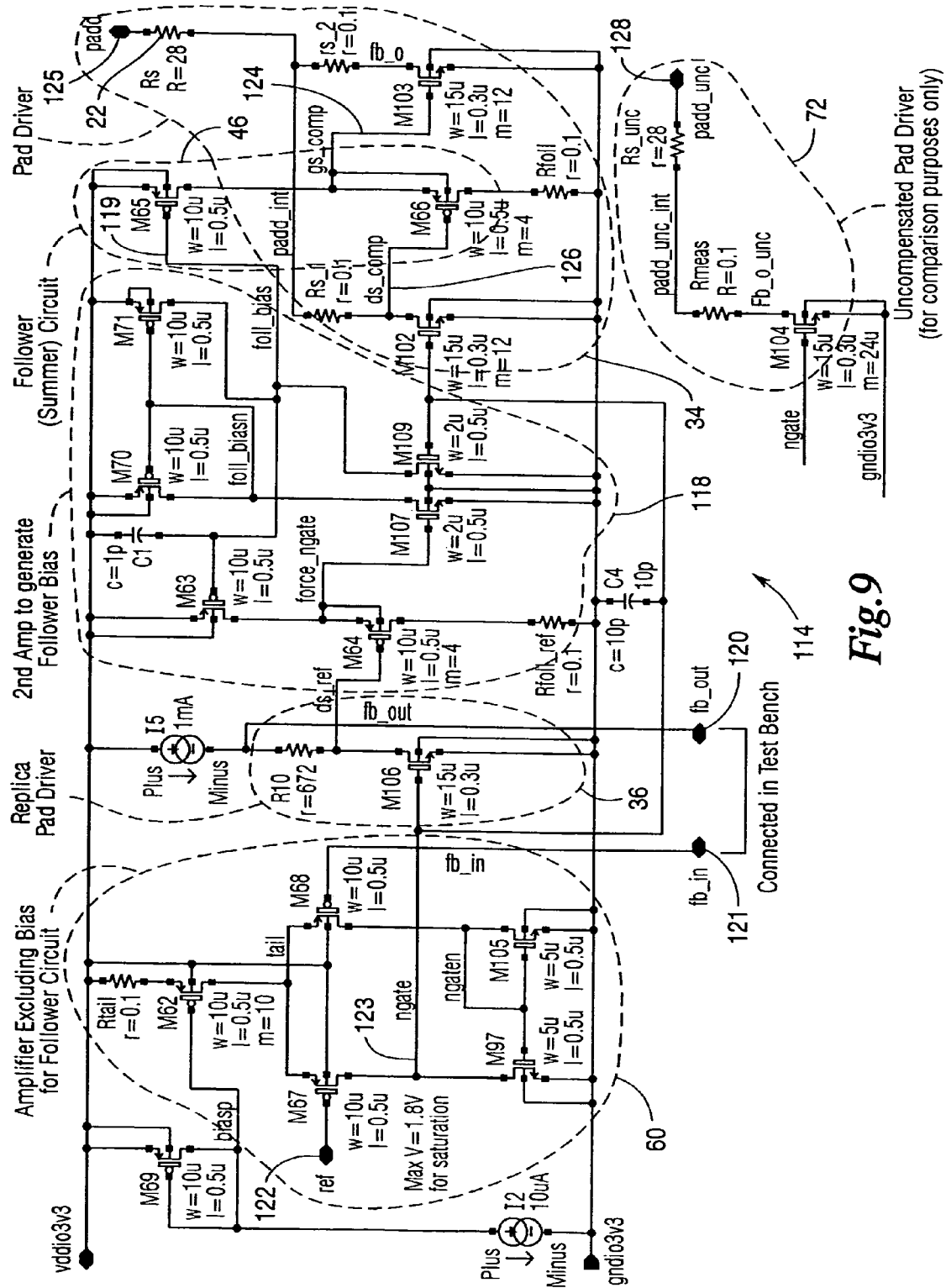
FIG. 9 is an exemplary schematic of a practical realization of the MOS driver circuit in FIG. 3 according to one embodiment of the present disclosure.

FIG. 9 is an exemplary schematic of a practical realization of the MOS driver circuit 32 in FIG. 3 according to one embodiment of the present disclosure. The "compensated" pad driver circuit (or MOS driver circuit) 114 in FIG. 9 is shown along with a conventional "uncompensated" pad driver 72 (similar to the driver circuit 12 in FIG. 2) just for comparison purpose. As FIG. 9 is a realization of the general circuit configuration in FIG. 3, the circuit blocks having similar functions in FIGS. 3 and 9 are denoted by the same reference numerals without assigning reference numerals to each circuit component in FIG. 9 (e.g., resistor, transistor, capacitor, etc.). Further, as the function of the circuit in FIG. 9 can be easily explained when a comparison of FIGS. 3 and 9 is made, a detailed description of the circuit components in FIG. 9 is omitted here for the sake of brevity. From a comparison of FIGS. 3 and 9, it is seen that the MOS driver circuit 114 in FIG. 9 includes the pad driver 34, the replica of the pad driver 36, the voltage summer circuit 46 (implemented in a voltage follower configuration), the inverting amplifier 60, and an additional amplifier 118. The amplifier 118 is an additional amplifier connected between the replica pad driver 36 and the voltage summer 46 to provide a bias for the follower circuit 46 on the line indicated by reference numeral "119" in FIG. 9. Thus, the inverting input 47 (FIG. 3) to the voltage summer 46 is not provided directly from the pad driver replica 36, but through the amplifier 118. It is observed that the Vref_fb signal is provided to the amplifier 60 when the test pads 120 and 121 are connected. Despite some implementational variations, the driver circuit 114 in FIG. 9 is functionally equivalent to the circuit 32 in FIG. 3.

The MOS driver circuit 114 of FIG. 9 may be used, with its PMOS input stage (in amplifier 60), when a low reference voltage (e.g., Vref=0.5V) is available. However, in the simulation of circuit 114, the value of 1.1V was used for Vref. Some points to note about the MOS driver circuit 114 of FIG. 9 are: (1) As noted before, a separate (2nd) amplifier 118 is used to generate the bias for the follower circuit 46. The amplifier 118 is shown 'unbiased', but a biased version could be used, if the NMOS (any of the NMOS in the circuit 114) $V_T$ is not too great. All NMOS in the circuit 114 may have $V_T$ values that change with process. The primary amplifier 60 and a follower bias amplifier 118 combination may be used so long as the improvement in MOS linear region linearity is not outweighed by the double offset of these two amplifiers 60, 118. (2) Ideally, the heavily capacitively loaded NMOS gate of the pad driver transistor M102 (FIG. 9) may compensate the amplifier 60 (dominant pole). However, in practice, the gate-drain capacitance of the pad driver NMOS (transistor M102) may create a significant amount of charge injection onto the gate node (of transistor M102) during pad switching. This may cause the gate node voltage to move considerably, necessitating the addition of a 'slugging' capacitor (capacitor C4 in FIG. 9). Generally, the voltage Vgs of transistor M102 should not change as the pad voltage switches; it (Vgs of M102) should preferably only change very slowly with PVT variations. However, the Vgs of M102 may move from its ideally static bias condition. For example, if the pad voltage is rising, then the capacitance between the drain and gate of M102 will tend to pull the Vgs node up, potentially by several 10's of mV. The impedance of M102 will therefore change. On the other hand, if the pad voltage is falling, then the capacitance between the drain and gate of M102 will tend to pull the Vgs node down, potentially by several 10's of mV. The impedance of M102 will again change. The amount of change in Vgs depends on the capacitive divider given by the following approximation:

$$\Delta Vgs = \Delta Vpad * (C_{drain\text{-}gate\ of\ M102}) / (C_{on\ node\ 123\ in\ FIG.\ 9}) \quad (6)$$

Therefore, the capacitor C4 of 10 pF is added on node 123 (FIG. 9) to minimize ΔVgs. There may however be more elaborate, less space-costly (i.e., silicon area) solutions, to this problem including, for example, use of a 2 stage push-pull amplifier (not shown) with a high UGBW (Unity Gain BandWidth) in place of the amplifier 60. (3) With this particular single stage differential amplifier circuit 60, it may be difficult to drive the gate of the NMOS pad driver (transistor M102) much above about 2V. Therefore, it may be necessary to oversize the driver NMOS (transistor M102) to cope with the worst case SS corner. This problem, however, may be overcome for the particular realization in FIG. 9, by replacing the PMOS input differential amplifier 60 with an NMOS input differential amplifier such as, for example, the amplifier 70 used in the circuit of FIG. 4. However, such an NMOS differential amplifier may require the reference voltage (Vref) at least a volt higher than that required by the PMOS amplifier.

SPICE Simulation Results for the Circuit 114 of FIG. 9

Figure 10A:
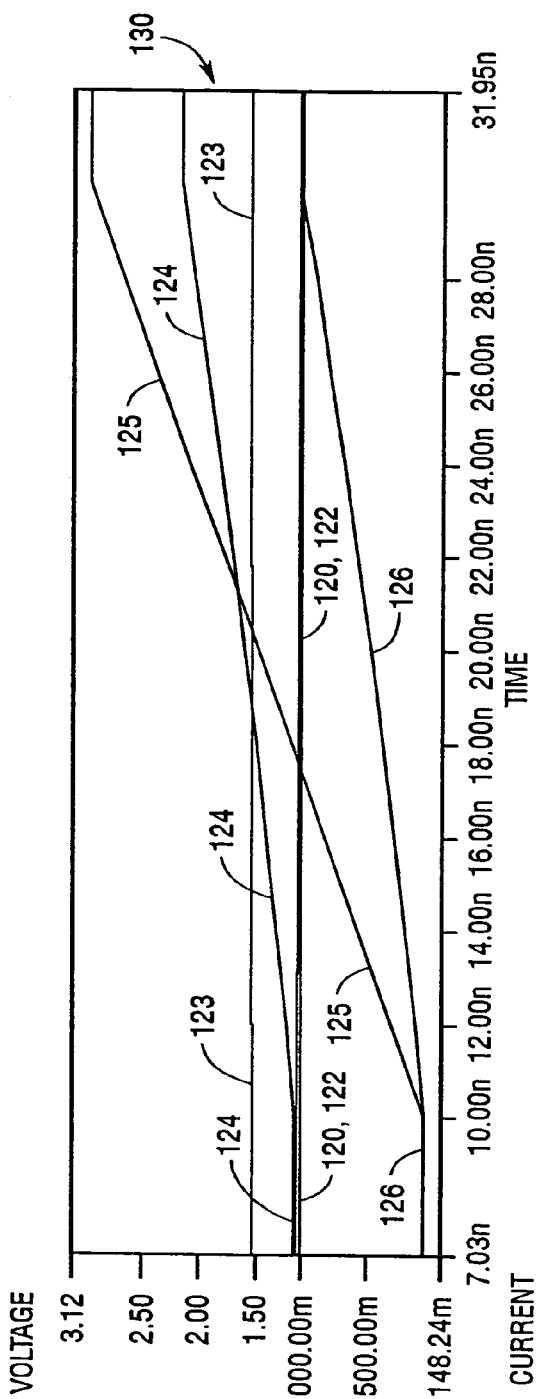
FIGS. 10A and 10B illustrate two diagrams showing plots of voltages and currents (versus time), respectively, at various terminals or points in the MOS driver circuit in FIG. 9 when the circuit is SPICE simulated in the slow SS corner, with rising edge for Vpad.
Figure 10B:
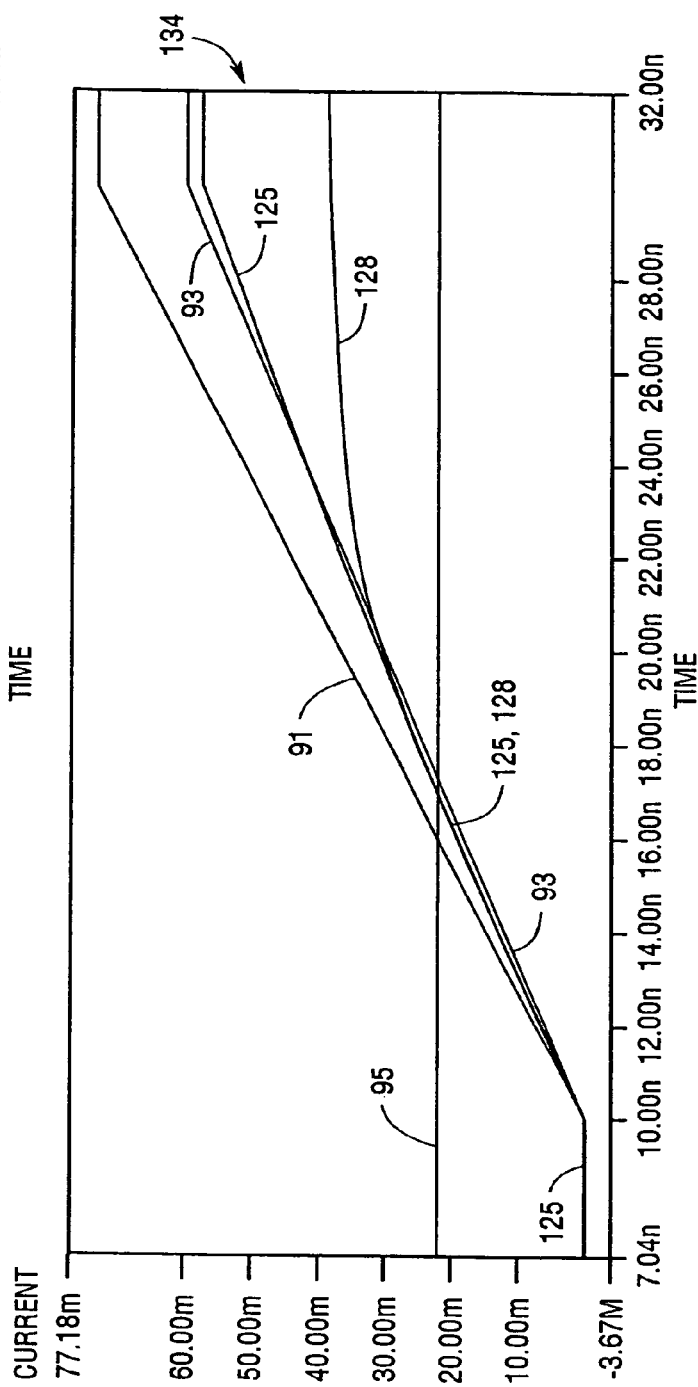

FIGS. 10A and 10B illustrate two diagrams 130, 134 showing plots of voltages and currents (versus time), respectively, at various terminals or points in the MOS driver circuit 114 in FIG. 9 when the circuit 114 is SPICE simulated in the slow SS corner, with rising edge for Vpad. The voltages in diagram 130 are measured in volts and mV, whereas the currents in diagram 134 are measured in mA. The time is given in nanoseconds in both diagrams. Various plots or graphs in the voltage diagram 130 are referenced by the same numerals as those used to identify corresponding test locations in the circuit in FIG. 9 where the voltage measurements are taken. For example, the voltage plot 126 corresponds to the voltage measurements taken at location 126 (the "ds_comp" signal line in the pad driver 34) in FIG. 9. Similarly, the voltage plot 124 corresponds to the voltage measurements taken at location 124 (the "gs_comp" signal line in the pad driver 34) in FIG. 9, the voltage plot 125 refers to the Vpad measurement at the circuit pad "padd" 125 (similar to the IC pad 24 in FIG. 3), and so on. In the same manner, the current diagram 134 includes a number of plots (except for the plots 91, 93, and 95) bearing reference numerals corresponding to the locations of current measurements in FIG. 9. For example, the current graph 125 corresponds to the current measurements taken at the "padd"

terminal 125 in FIG. 9, thereby taking the Rpad into account. Similarly, the current plot 128 corresponds to the current measurements taken at the "padd-unc" terminal 128 in FIG. 9, thereby taking the Rpad of the uncompensated driver 72 into account. The ideal plots 91, 93, and 95 are already noted hereinbefore with reference to FIG. 5B. It is seen from the voltage plot 123 in FIG. 11A for the slow SS corner (worst for MOS drive capability) that the Vgs of the pad driver NMOS (i.e., transistor M102) is well below supply Vdd (which is depicted at graph 83 in FIG. 5A), at just 1.6V. Even so, curvature compensation is not really needed for the Vpad voltage range of interest (i.e., below the 22 mA line 95 in the diagram 134). Because of the 'double amplifier offset' (resulting from the use of the primary amplifier 60 and the bias amplifier 118) discussed hereinbefore, both the compensated (plot 125) and uncompensated (plot 128) pad impedances are not well centered at the point of calibration, which is Vpad=Vref=1.1V.

Figure 11A:
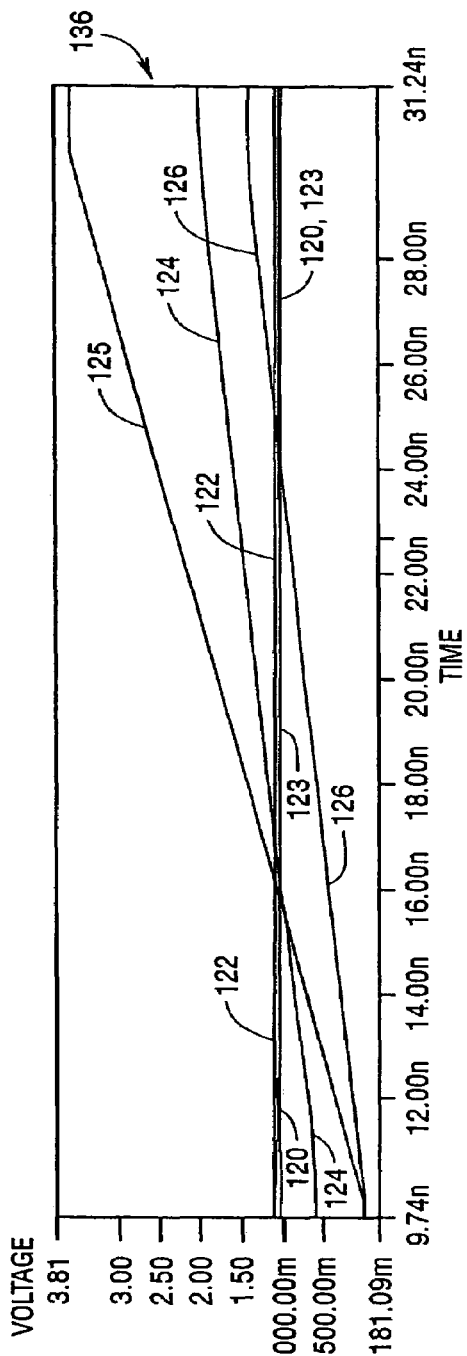
FIGS. 11A and 11B illustrate two diagrams showing plots of voltages and currents (versus time), respectively, at various terminals or points in the MOS driver circuit in FIG. 9 when the circuit is SPICE simulated in the fast (FF) corner, with rising edge for Vpad.
Figure 11B:
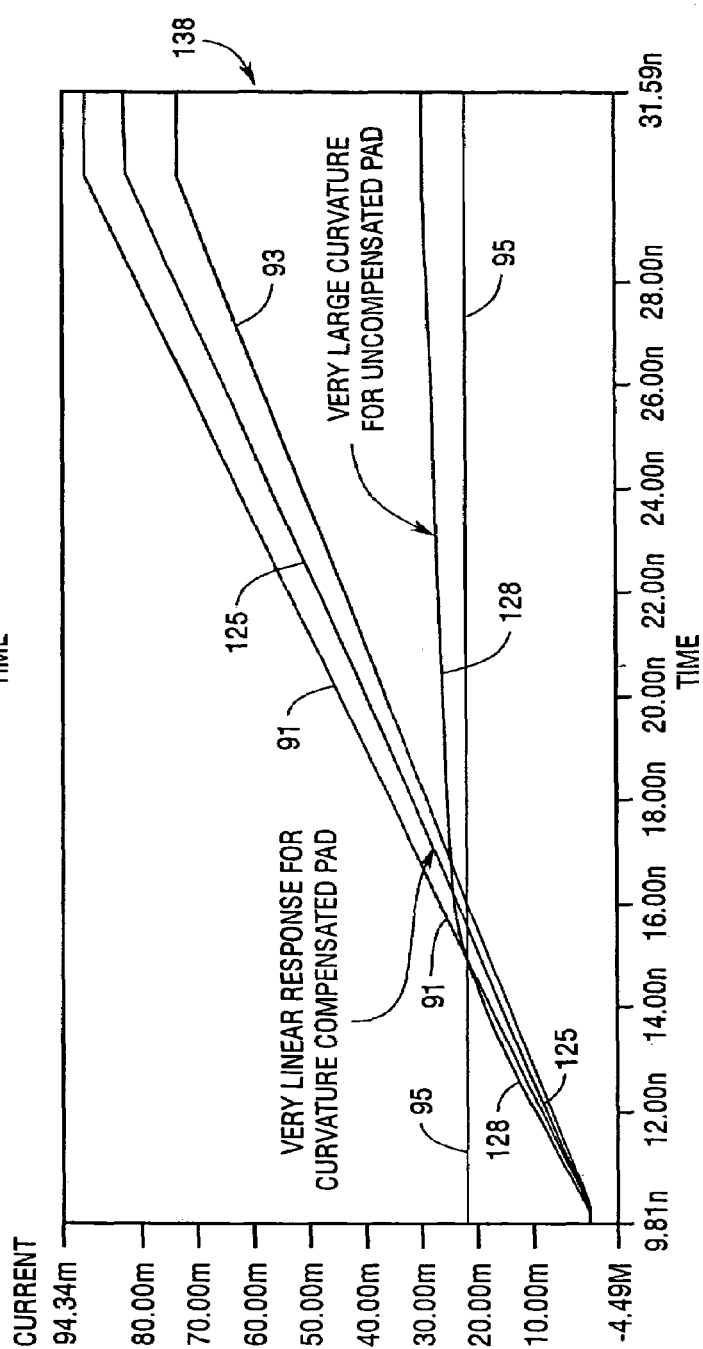

FIGS. 11A and 11B illustrate two diagrams 136, 138 showing plots of voltages and currents (versus time), respectively, at various terminals or points in the MOS driver circuit 114 in FIG. 9 when the circuit 114 is SPICE simulated in the fast (FF) corner, with rising edge for Vpad. The voltages in diagram 136 are measured in volts and mV, whereas the currents in diagram 138 are measured in mA. The time is given in nanoseconds in both diagrams. Various plots or graphs in the diagrams 136, 138 are referenced in the same manner as that described above with reference to FIGS. 10A-10B. Therefore, no additional explanation of various plots in FIGS. 11A-11B is provided. As can be seen from plot 123 in FIG. 11A, in the fast FF corner (best for MOS drive capability), the Vgs of the pad driver NMOS (i.e., transistor M102) has dropped to just a bit more than 1.0V. This leads to a large linear region MOS impedance curvature for the uncompensated pad (as can be seen from graph 128 in FIG. 11B). The compensated pad (i.e., the circuit 114), however, is linear as can be seen from graph 125 in FIG. 11B. This illustrates the effect of curvature compensation according to the present disclosure. When it is difficult to drive a MOS gate voltage to full Vdd supply (perhaps because of reliability concerns with technology limits, or because of the use of a very thin oxide high drive MOS (to a terminating voltage<Vdd) for maximum drive), then using the methodology described in the present disclosure it may be possible to eliminate the MOS linear region curvature that would otherwise make the impedance spread too great.

Third Circuit Realization of FIG. 3

Figure 12:
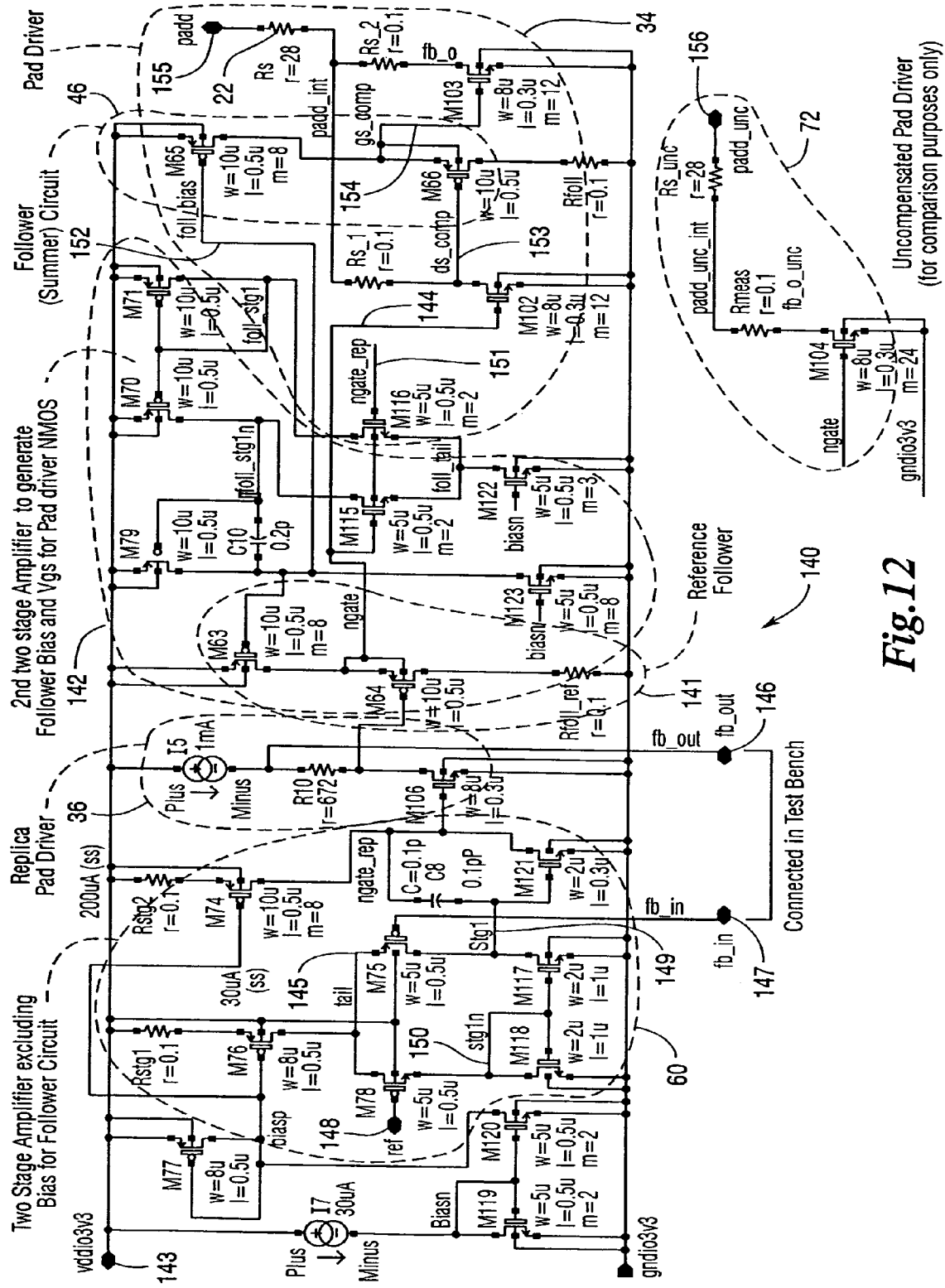
FIG. 12 is an exemplary schematic of a practical realization of the MOS driver circuit in FIG. 3 according to one embodiment of the present disclosure.

FIG. 12 is an exemplary schematic of a practical realization of the MOS driver circuit 32 in FIG. 3 according to one embodiment of the present disclosure. The "compensated" pad driver circuit (or MOS driver circuit) 140 in FIG. 12 is shown along with a conventional "uncompensated" pad driver 72 (similar to the driver circuit 12 in FIG. 2) just for comparison purpose. As FIG. 12 is a realization of the general circuit configuration in FIG. 3, the circuit blocks having similar functions in FIGS. 3 and 12 are denoted by the same reference numerals without assigning reference numerals to each circuit component in FIG. 12 (e.g., resistor, transistor, capacitor, etc.). Further, as the function of the circuit in FIG. 12 can be easily explained when a comparison of FIGS. 3 and 12 is made, a detailed description of the circuit components in FIG. 12 is omitted here for the sake of brevity. From a comparison of FIGS. 3 and 12, it is seen that the MOS driver circuit 140 in FIG. 12 includes the pad driver 34, the replica of the pad driver 36, the voltage summer circuit 46 (implemented in a voltage follower configuration), the amplifier 60, and an additional amplifier 142 having a reference follower circuit 141. It is noted that the amplifier 60 in the embodiment of FIG. 12 is a two-stage amplifier, whereas the same amplifier is shown as a single stage amplifier in the embodiment of FIG. 9. The amplifier 142 is an additional two-stage amplifier connected between the replica pad driver 36 and the combination of the pad driver 34 and the voltage summer 46 to provide a bias for the follower circuit 46 (on the line indicated by reference numeral "152" in FIG. 12) and the Vgs (on line 144) for the pad driver NMOS transistor M102. Thus, the inverting input 47 (FIG. 3) to the voltage summer 46 is not provided directly from the pad driver replica 36, but through the amplifier 142. It is observed that the Vref_fb signal is provided to the amplifier 60 when the test pads 146 and 147 are connected. Despite some implementational variations, the driver circuit 140 in FIG. 12 is functionally equivalent to the circuit 32 in FIG. 3.

The MOS driver circuit 140 in FIG. 12 is considerably more complex than the realization shown in FIG. 4. The MOS driver circuit 140 of FIG. 12 may be used, with its PMOS input stage (in amplifier 60), when a low reference voltage (e.g., Vref=0.5V) is available. However, in the simulation of circuit 140, the value of 1.1V was used for Vref. Some points to note about the MOS driver 140 in FIG. 12 are: (1) Unlike the previous circuit 114 of FIG. 9, the circuit 140 in FIG. 12 may be able to drive the gate of the NMOS (line 144 of transistor M102) close to Vdd because of the extra amplifier (level shifting) stage (i.e., the second stage in the two-stage amplifier 142). (2) Additional stabilization may be desirable for the circuit 140 in the FF corner. (3) The increased voltage gain of the two-stage amplifier 60 may minimize input offsets. Therefore, it may be possible to use a second amplifier (here, the additional two-stage amplifier 142) to generate the follower bias (on line 152), without the compound amplifier offsets being too high. (4) The biased two-stage amplifier 142 may be a more robust solution than the unbiased amplifier 118 used in FIG. 9. (5) It may be desirable to connect the output of the main amplifier 60 to the gate of the pad driver 34 NMOS transistor M102 (i.e., the 'ngate' node 144 in FIG. 12) and perform a pole-zero cancellation technique for compensation (R-C rather than simple C), instead of using the second two-stage amplifier 142 to supply the Vgs for pad driver NMOS. Alternatively, it may be possible to use a two stage push-pull amplifier (not shown) (first stage diode connected, and the second stage cascoded for high output resistance) for the amplifier circuit 60 and drive the heavily loaded 'ngate' node 144 directly (i.e., without using the amplifier 142 to supply the Vgs for pad driver NMOS transistor M102).

SPICE Simulation Results for the Circuit 140 of FIG. 12

Figure 13A:
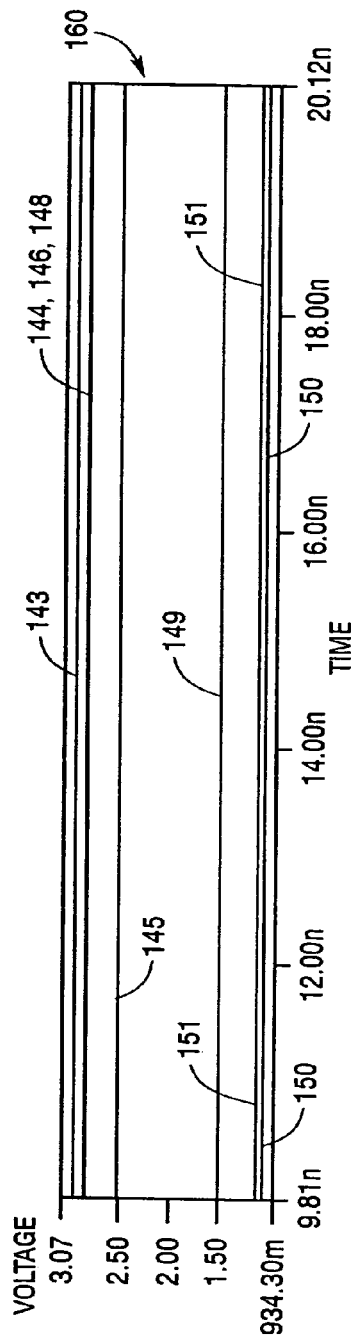
FIGS. 13A-13C illustrate three diagrams showing plots of voltages and currents (versus time) at various terminals or points in the MOS driver circuit in FIG. 12 when the circuit is SPICE simulated in the slow SS corner, with rising edge for Vpad.
Figure 13B:
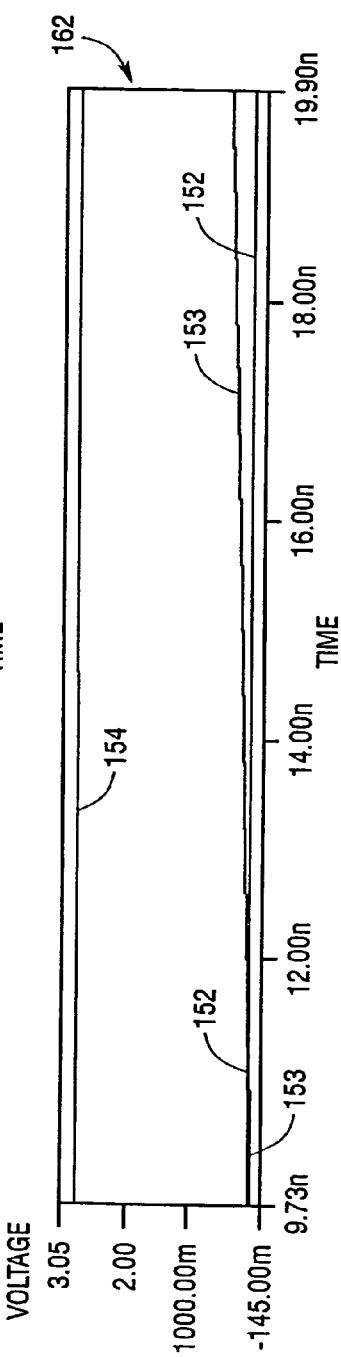
Figure 13C:
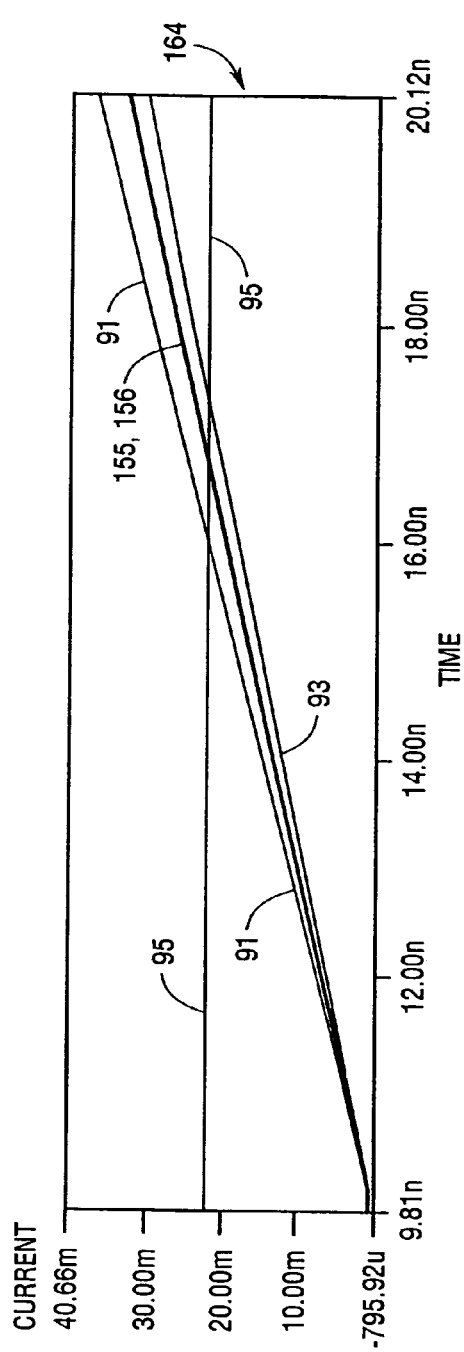

FIGS. 13A-13C illustrate three diagrams 160, 162, 164 showing plots of voltages and currents (versus time) at various terminals or points in the MOS driver circuit 140 in FIG. 12 when the circuit 140 is SPICE simulated in the slow SS corner, with rising edge for Vpad. The voltages in diagrams 160, 162 are measured in volts and mV, whereas the currents in diagram 164 are measured in mA and µA. The time is given in nanoseconds in all diagrams. Various plots or graphs in the voltage diagrams 160, 162 in FIGS. 13A-13B are referenced by the same numerals as those used to identify corresponding test locations in the circuit in FIG. 12 where the voltage measurements are taken. For example, the voltage plot 153 corresponds to the voltage measurements taken at location 153 (the "ds_comp" signal line in the pad driver 34) in FIG. 12. Similarly, the voltage plot 149 corresponds to the voltage measurements taken at location 149 (the "stg1" signal line in the amplifier 60) in FIG. 12, the voltage plot 151 refers to the voltage measurement at the "ngate_rep" terminal 151 in the pad driver circuit 34, and so on. In the same manner, the current diagram 164 in FIG. 13C includes a number of plots (except for the plots 91, 93, and 95) bearing reference numerals corresponding to the locations of current measurements in FIG. 12. For example, the current graph 155 corresponds to the current measurements taken at the "padd" terminal 155 in FIG. 12 (similar to the IC pad 24 in FIG. 3), thereby taking the Rpad into account. Similarly, the current plot 156 corresponds to the current measurements taken at the "padd-unc" terminal 156 in FIG. 12, thereby taking the Rpad of the uncompensated driver 72 into account. The ideal plots 91, 93, and 95 are already noted hereinbefore with reference to FIG. 5B.

FIGS. 14A-14C illustrate three diagrams 166, 168, 170 showing plots of voltages and currents (versus time) at various terminals or points in the MOS driver circuit 140 in FIG. 12 when the circuit 140 is SPICE simulated in the fast (FF) corner, with rising edge for Vpad. The voltages in diagrams 166, 168 are measured in volts and mV, whereas the currents in diagram 170 are measured in mA and µA. The time is given in nanoseconds in both diagrams. Various plots or graphs in the diagrams 166, 168, 170 are referenced in the same manner as that described above with reference to FIGS. 13A-13C. Therefore, no additional explanation of various plots in FIGS. 14A-14C is provided.

It is observed that various current and voltage graphs in FIGS. 13A-13C, 14A-14C are substantially similar to various graphs in FIGS. 5A-5B, 6A-6B representing voltages and currents at corresponding locations in the circuit 68 in FIG. 4. Because of the similarity of FIGS. 13A-13C, 14A-14C and FIGS. 5A-5B, 6A-6B, no additional explanation is provided for plots in FIGS. 13A-13C, 14A-14C. Thus, although the circuit 140 in FIG. 12 is considerably more complex than the circuit 68 in FIG. 4, the overall performance of both of those circuits is substantially similar.

Performance of Circuit 68 in FIG. 4 in HS Mode

It is noted that in USB2.0, for example, not only does pad impedance (Rpad) have to be controlled to within 45 Ohms +/− 10% during FS (Full Speed, 12 Mega Bits per second) mode of operation, but that the MOS driver/buffer (e.g., the circuit 32 in FIG. 3) in the FS mode may also be used as a ground reference impedance for HS (High Speed, 480 Mega Bits per second) mode of operation of the MOS buffer.

Figure 16A:
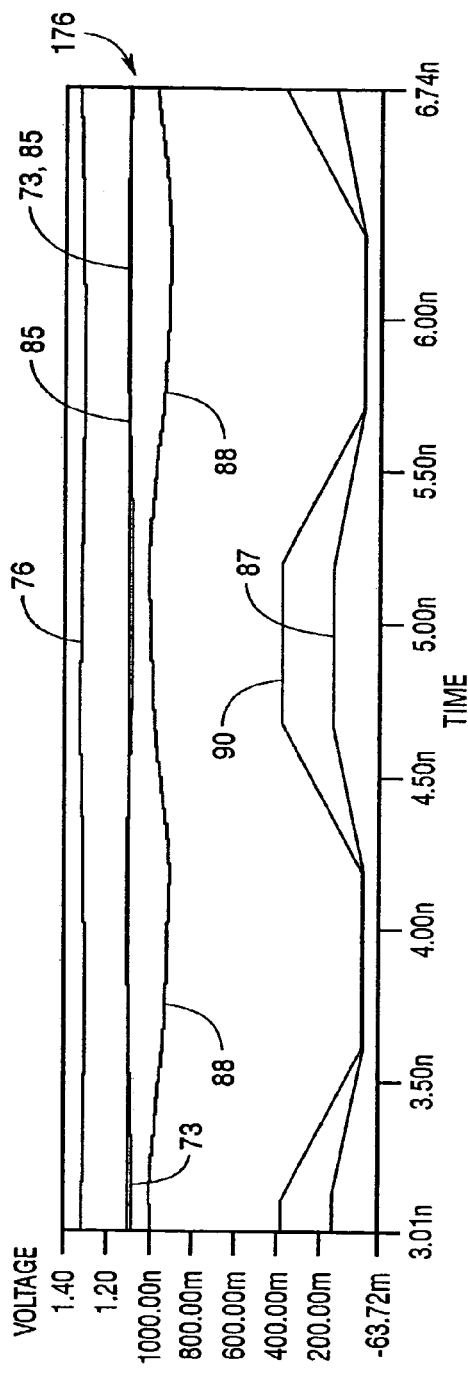
FIGS. 16A and 16B illustrate fast (FF) corner results of SPICE simulation of the MOS driver in FIG. 4 in the HS mode.
Figure 16B:
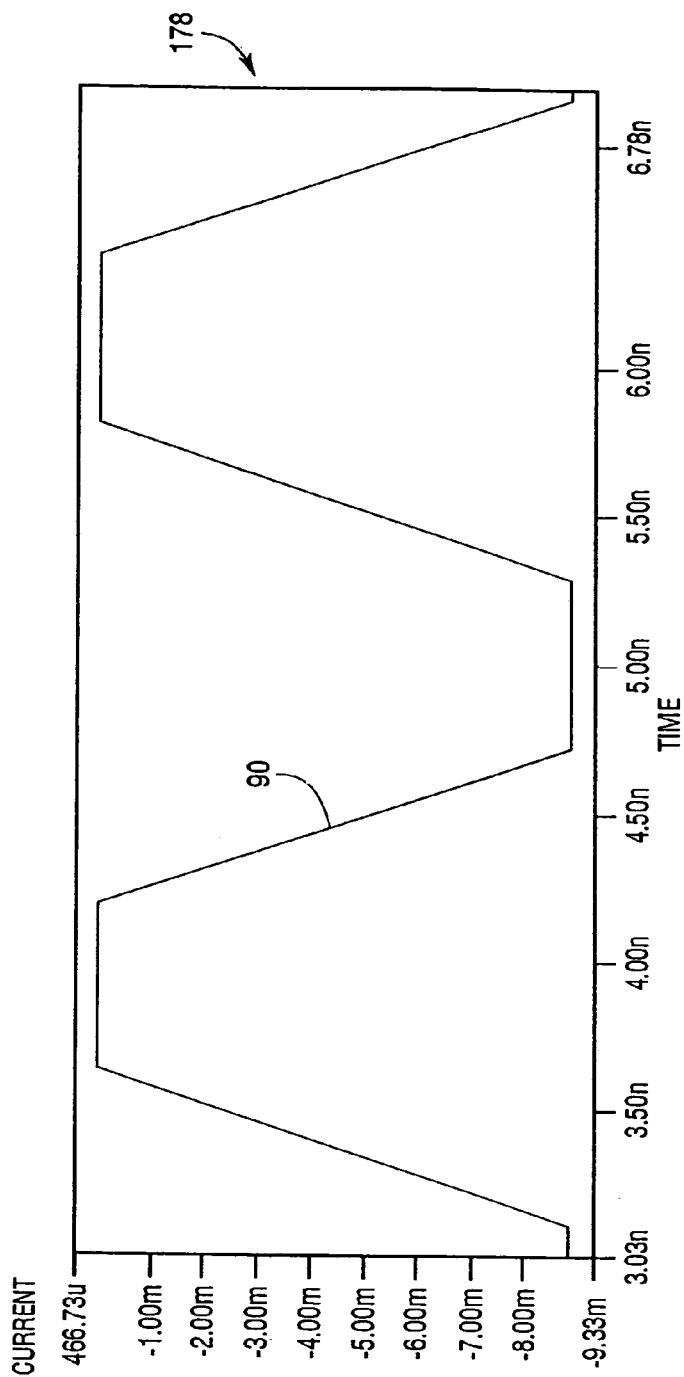

FIGS. 15A-15B illustrate slow (SS) corner results of SPICE simulation of the MOS driver circuit 68 in FIG. 4 in the HS mode, whereas FIGS. 16A-16B illustrate fast (FF) corner results of SPICE simulation of the MOS driver 68 in FIG. 4 in the HS mode. FIGS. 15A-15B and 16A-16B show diagrams 172, 174, 176, 178 of voltages and currents (versus time) at various terminals or points in the MOS driver circuit 68 in FIG. 4 when the circuit 68 is SPICE simulated in the HS mode. The voltages in diagram 172 are measured in volts, whereas they are measured in V and mV in diagram 176. The currents in diagram 174 are measured in amperes, whereas they are measured in µA and mA in diagram 178. The time is given in seconds in diagrams 172, 174, whereas it is given in nanoseconds in diagrams 176, 178. Various plots or graphs in the voltage diagrams 172, 176 are referenced by the same numerals as those used to identify corresponding test locations in the circuit in FIG. 4 where the voltage measurements are taken. For example, the voltage plot 90 corresponds to the voltage measurements (Vpad) taken at location "padd" 90 (similar to the IC pad 24 in FIG. 3) in FIG. 4. Similarly, the voltage plot 87 corresponds to the voltage measurements taken at location 87 (the "fb_int-_comp" line) in FIG. 4, the voltage plot 76 corresponds to the voltage measurements taken at location 76 (the "y" line) in FIG. 4, and so on. In the same manner, the current diagrams 174, 178 include plots 90 that correspond to the measurements of current flowing through the internal linearizing resistor Rs 22 (FIG. 4), i.e., current measurements taken at the "padd" terminal 90 in FIG. 4, thereby taking the Rpad into account.

The results depicted in FIGS. 15A-15B and 16A-16B were obtained by instantiating two parallel USB1.1 buffers (not shown) (each buffer similar to the circuit 68 in FIG. 4) with combined nominal resistance of 22.5 Ohms. A current source of 17.77 mA was injected into the buffers at 480 MHz, with rise and fall times of 500 ps. The slow and fast corner results of the simulation are shown in FIGS. 15A-15B and 16A-16B respectively. Both results show that the output high level of impedance Rpad is well within the USB2.0 specification limits of 45 Ohms +/− 10%. However, in all of FIGS. 15A-15B and 16A-16B the levels of impedance values are slightly low. This may be corrected by circuit optimizations, for example, by changing Vref and/or changing the values of series resistors Rs and 2*m*Rs (shown in FIG. 3). The waveforms in FIGS. 15A-15B and 16A-16B are for a scenario where an impedance controlled pad driver circuit according to the present disclosure (e.g., the parallel USB1.1 buffers mentioned at the beginning of this paragraph, with 45 Ohms ground referenced resistive termination for the HS mode) is used as a termination resistor. The simulations in FIGS. 15A-15B and 16A-16B emulate HS mode data transmission in USB2.0, with a 480 MHz clock signal.

It is observed that it may be desirable to build a "high side" impedance control circuit for a MOS driver circuit built according to the teachings of the present disclosure (i.e., built similar to the driver circuit 32 in FIG. 3). A "high side" impedance control circuit may be used to control the high driving impedance of an IC pad. Such an impedance control circuit may be designed as a mirror image of the MOS driver circuit in FIG. 3. As is known in the art, in the mirror circuit (mirrored in the y-axis) (not shown), for example, transistors M1, Ma and Mb in FIG. 3 would become PMOS devices, the current source 58 would change to a current sink, etc. For example, FIG. 17 (discussed below) shows how to generate the reference voltages ($V_{REF\_L}$ and $V_{REF\_H}$) for low and high side impedance control.

It is further observed that throughout the discussion of various MOS driver circuit configurations provided herein with reference to FIGS. 3, 4, 9, and 12, the nominal resistor values (for various resistors in the circuits described hereinbefore) were chosen at 0° C. In case of Rpad under USB2.0 specification, for example, this may mean that a +/− 10% process spread and a −5% (−40° C.) to +20% (105° C.) temperature spread, the total effective spread may be −15% to +30%. Therefore, for a resistance Rpad centered on 45 Ohms (as required under USB2.0, for example), it may be preferable to choose a nominal resistance value of about 42 Ohms to accommodate these PT spreads and still comply with the USB2.0 requirements. This nominal resistance value correction factor may be applied to the circuits in FIGS. 3, 4, 9, and 12.

Probable Bandgap Reference Considerations

It is noted that in the exemplary MOS driver circuits in FIGS. 4, 9, and 12, a 1.1V reference voltage Vref has been used. However, some of the circuits (e.g., circuit 114 in FIG. 9 and circuit 140 in FIG. 12) may be made to work with a lower reference Vref (for example, 0.55V). The simplest circuit 68 of FIG. 4 may not function with a reference voltage Vref much below 1.1V, because of its NMOS input stage (in amplifier 70). It is observed, however, that a higher voltage reference (e.g., Vref=Vdd−1.1V) may be needed for the high side impedance Control noted hereinbefore. Therefore, it may not be necessary to choose a reference best suited for impedance control, because the bandgap may have to produce >1 voltage references.

Figure 17:
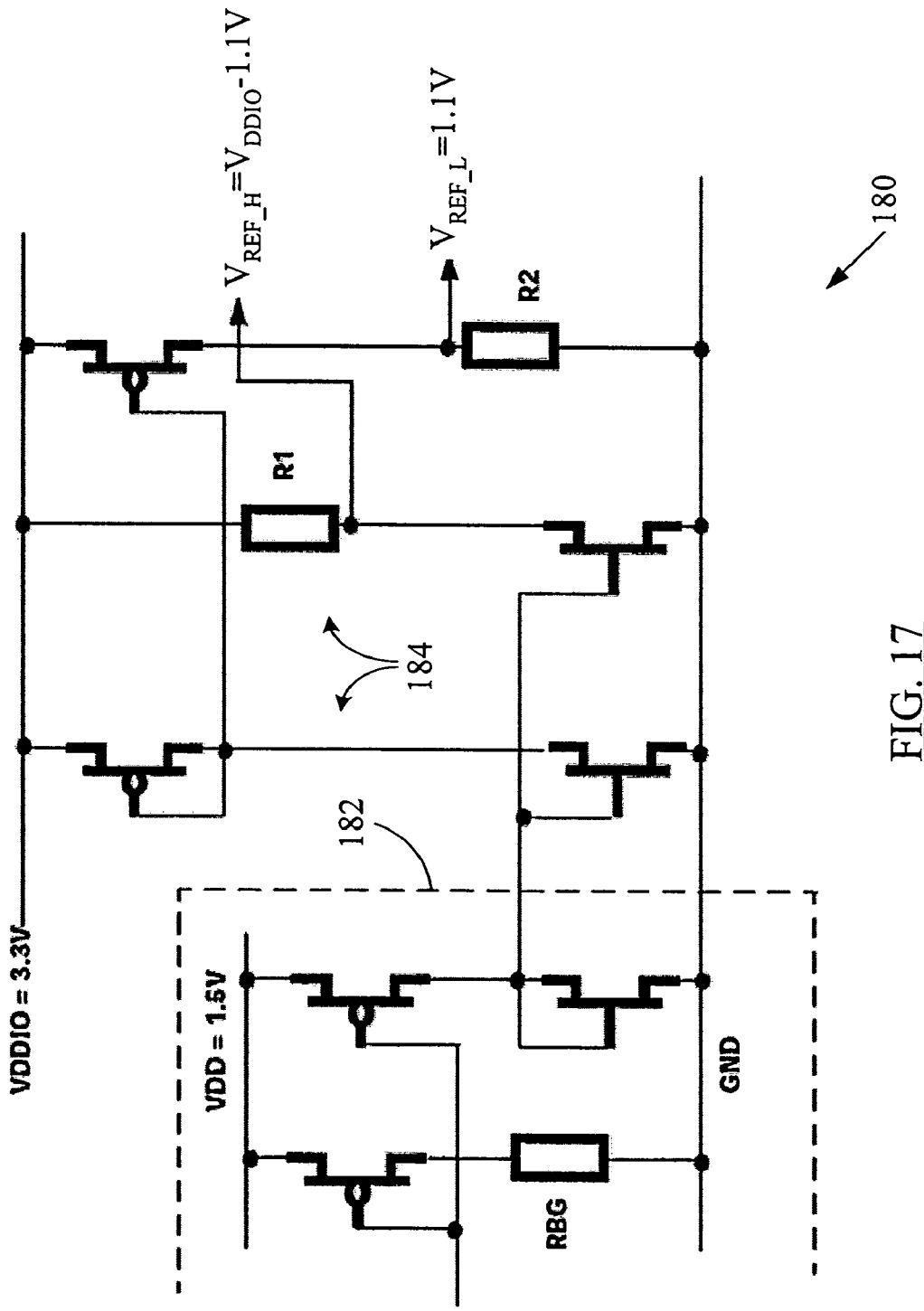
FIG. 17 illustrates how, when a bandgap circuit operates on a supply other than the 3.3V used for a pad driver circuit according to the present disclosure (e.g., on a 1.5V supply), one can effectively "level shift" the bandgap voltage to generate the required high and low values for the reference voltage (Vref) to a MOS pad driver circuit constructed according to teachings of the present disclosure.

FIG. 17 illustrates how, when a bandgap circuit operates on a supply other than the 3.3V used for a pad driver circuit according to the present disclosure (e.g., on a 1.5V supply), one can effectively "level shift" the bandgap voltage to generate the required high and low values for the reference voltage (Vref) to a MOS pad driver circuit (e.g., any MOS driver circuit based on the general circuit configuration 32 in FIG. 3) constructed according to teachings of the present disclosure. The exemplary circuit configuration 180 shown in FIG. 17 includes an additional stage 182 to the bandgap circuit (not shown) running on a 1.5V analog supply voltage and a cascode stage 184 (for current precision) in series with the additional stage 182. The bandgap circuit (not shown) precedes the additional stage 182. The resistors RBG, R1, and R2 are matched and inter-digitated (i.e., laid out together, rather than individually). The circuit 180 is shown to provide two reference outputs: the low reference voltage Vref_L=1.1V, and the high reference voltage Vref_H=Vdd-1.1V. The Vref_L voltage may be supplied as a Vref input to a MOS driver circuit constructed according to the teachings of the present disclosure (e.g., the Vref input 62 in the circuit 32 in FIG. 3, or the "ref" reference voltage terminal 85 in the circuit 68 in FIG. 4, etc.), whereas the Vref_H voltage may be fed as a reference voltage to a y-axis mirror image (not shown) of the MOS driver circuit (e.g., the circuit 32 in FIG. 3) discussed hereinbefore with reference to high side impedance control.

Using USB1.1 Buffer Stand Alone (Not within a USB2.0 PHY)

A MOS driver circuit constructed according to the teachings of the present disclosure (e.g., the MOS driver circuit 32 in FIG. 3) may be used as a stand alone USB1.1 buffer/driver, instead of a USB1.1 buffer within a USB2.2 PHY device. Two exemplary ways of using the driver circuit 32 as a stand alone USB1.1 buffer are discussed hereinbelow with reference to FIGS. 18 and 19.

Figure 18:
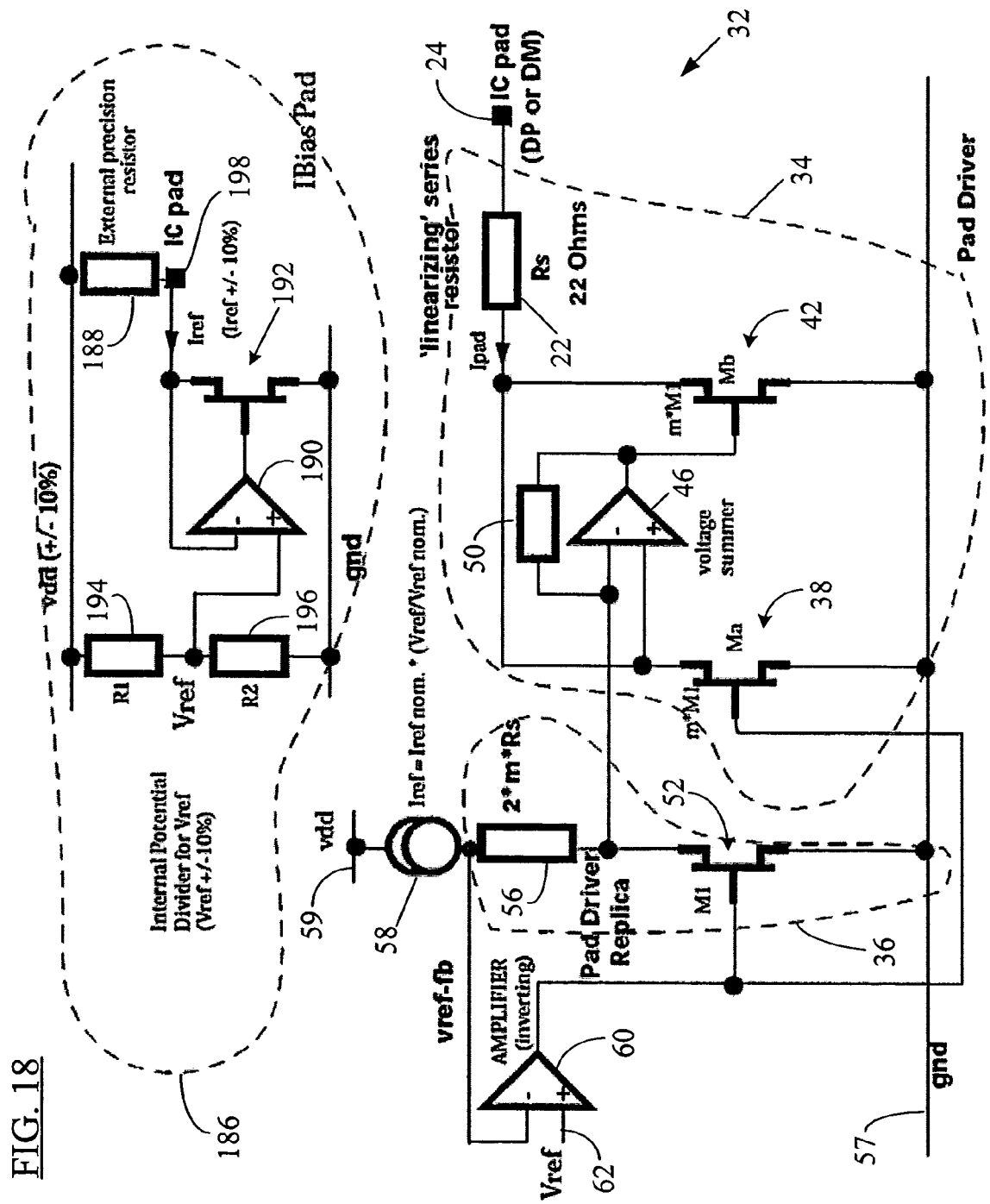
FIG. 18 illustrates the MOS driver circuit in FIG. 3 with the current reference "Iref" supplied by a separate bias generator so as to allow the use of the driver circuit as a stand alone USB1.1 buffer.

FIG. 18 illustrates the MOS driver circuit 32 in FIG. 3 with the current reference "Iref" supplied by a separate bias generator 186 so as to allow the use of the driver circuit 32 as a stand alone USB1.1 buffer. As the MOS driver circuit 32 in FIG. 18 is the same circuit shown in FIG. 3, only some of the major circuit elements are identified with reference numerals for the sake of clarity. The separate bias generator 186 may include an external precision resistor 188, an NMOS transistor 192, a differential amplifier 190, and a voltage divider network consisting of resistors R1 (194) and R2 (196). An internal potential divider (of resistors R1 and R2) may allow Vref to be stable within +/− 10%. The Vref generated at the junction of resistors R1 (194) and R2 (196) may be supplied to the non-inverting terminal 62 of the op-amp 60, and the current reference Iref 58 may be obtained from the current flowing into the drain of transistor 192.

The separate bias generator 186 may be available in the market as a USB1.1 pad. The bias pad 186 may be a dedicated pad with the external precision (within 1%) resistor 188. The bias pad 186 need not be a bandgap reference generator. In one embodiment, the bias generator 186 may have five (5) current outputs (not shown) for up to five USB1.1 MOS drivers (each similar to the driver 32). In the arrangement shown in FIG. 18, the value of internal linearizing resistor Rs may have to be reduced (from 28 to 22 Ohms) to meet the lower overall USB1.1 stand alone impedance specification of 28 to 44 Ohms. It is noted that this new Rs value of 22 Ohms may apply to a common schematic for the stand-alone version of the MOS driver circuit 32 (e.g., the configuration illustrated in FIG. 18) and a version of the circuit 32 used within a USB2.0 PHY (e.g., the configurations illustrated in FIGS. 4, 9, and 12). This may however mean that the gate of a MOS pad driver (e.g., the gate 39 of transistor Ma in FIG. 3) may be driven slightly lower than the optimal maximum (Vgs). That may be of no concern, however, as the curvature adjust mechanism may not be affected by slight deviations from the maximum Vgs.

Some points to note about the separate bias generator configuration in FIG. 18 are: (1) No external termination resistors (similar to the internal linearizing resistor Rs) may be required for DP and DM IC pads. It is observed here that in USB1.1 and USB2.0, differential IC pads are used, i.e., there are actually two IC pads (DP or D+ and DM or D−), each pad connected to a MOS driver circuit like the circuit 32 in FIG. 3. Therefore, for example, in case of five (5) USB1.1 buffers (each similar to circuit 32), it may be possible to save ten (10) such external resistors because, as noted before, a single bias generator 186 may provide reference currents to all five USB1.1 buffers. (2) The same bias generator pad 186 may be used for a USB1.1 stand alone buffer and for a USB1.1 buffer inside a USB2.0 PHY. (3) Reasonably precise control of slew rates may be obtained from relatively precise current reference provided by the bias pad 186. (4) The approach illustrated in FIG. 18 requires use of an additional pad 198 to which an external precision resistor 188 must be connected. However, as noted before, only one additional pad may be needed for up to five USB1.1 buffers. (5) The use of a separate bias pad 186 for current reference may require a slightly larger (10%) MOS transistor M1 (52) in the pad driver replica 36. Unlike when Vref is generated by a band-gap (e.g., as discussed hereinbefore with reference to FIG. 17), in the scheme of FIG. 18, Vref has a +/− 10% spread because it is generated using a simple potential divider of R1 (194) and R2 (196). Therefore, the voltage at the replica IC pad 198 will vary from approximately 1.2V to 1.1V to 1.0V as Vdd varies from 3.6V to 3.3V to 3.0V. The voltage across the external precision resistor 188 will therefore vary by +/− 10% (with nominal value obtained when Vdd is at its nominal value of 3.3V) and so the current through the external resistor 188 will vary by +/− 10%. Therefore, Iref 58 varies by +/− 10%. If the reference current (Iref 58) is 10% higher than the nominal, then the gate voltage of M1 (52) must increase to pass the increased current. If Vgs of M1 cannot however increase (e.g., because the amplifier 60 cannot output more voltage), then the size of the M1 must be increased by 10%.

In the USB1.1 stand alone operation depicted in the embodiment of FIG. 18, it may be desirable to choose a higher nominal Iref value so that pad impedance (Rpad) at IC pad 24 will be less than 44 Ohms (the upper limit on the stand alone overall impedance specification under USB1.1). For example, suppose that 2*m=24 (m=12 fingers) and that nominal Vref (Vref.nom)=1.1V. (1) In case of a USB1.1 buffer within a USB2.0 PHY, replica pad resistance=2*m*Rs=24*22=528 Ohms. Here, the impedance of NMOS M1 (52) may be adjusted such that it provides 552 Ohms, making a total of 1080 Ohms pad driver replica resistance. Hence, Iref may be chosen equal to 1.02 mA so that Vref.nom=Vref_fb=1.02 mA*1080 Ohms=1.1V. (2) On the other hand, for USB1.1 buffer in stand alone configuration (similar to that shown in FIG. 18), the nominal value of Iref may be chosen, for example, 15% higher at 1.15 mA. The replica pad resistance remains the same at 2*m*Rs=24*22=528 Ohms and the impedance of NMOS M1 (52) may be adjusted such that it provides 428 Ohms, thereby making the total replica resistance of 956 Ohms. This means that Vref.nom=Vref_fb=1.15 mA*956=1.1V, which is suitable for the stable operation of the amplifier 60. With these values, Rpad turns out to be equal to 956/24=40 Ohms, which is well below the 44 Ohms upper limit (noted before) for a USB1.1 stand alone buffer. Because the percentage change in Iref (+/− 10%) is the same as that in Vref, overall trimmed impedance (Rpad) may remain constant with changes in Vdd. Hence, no bandgap voltage may be needed for the bias generator 186.

Figure 19:
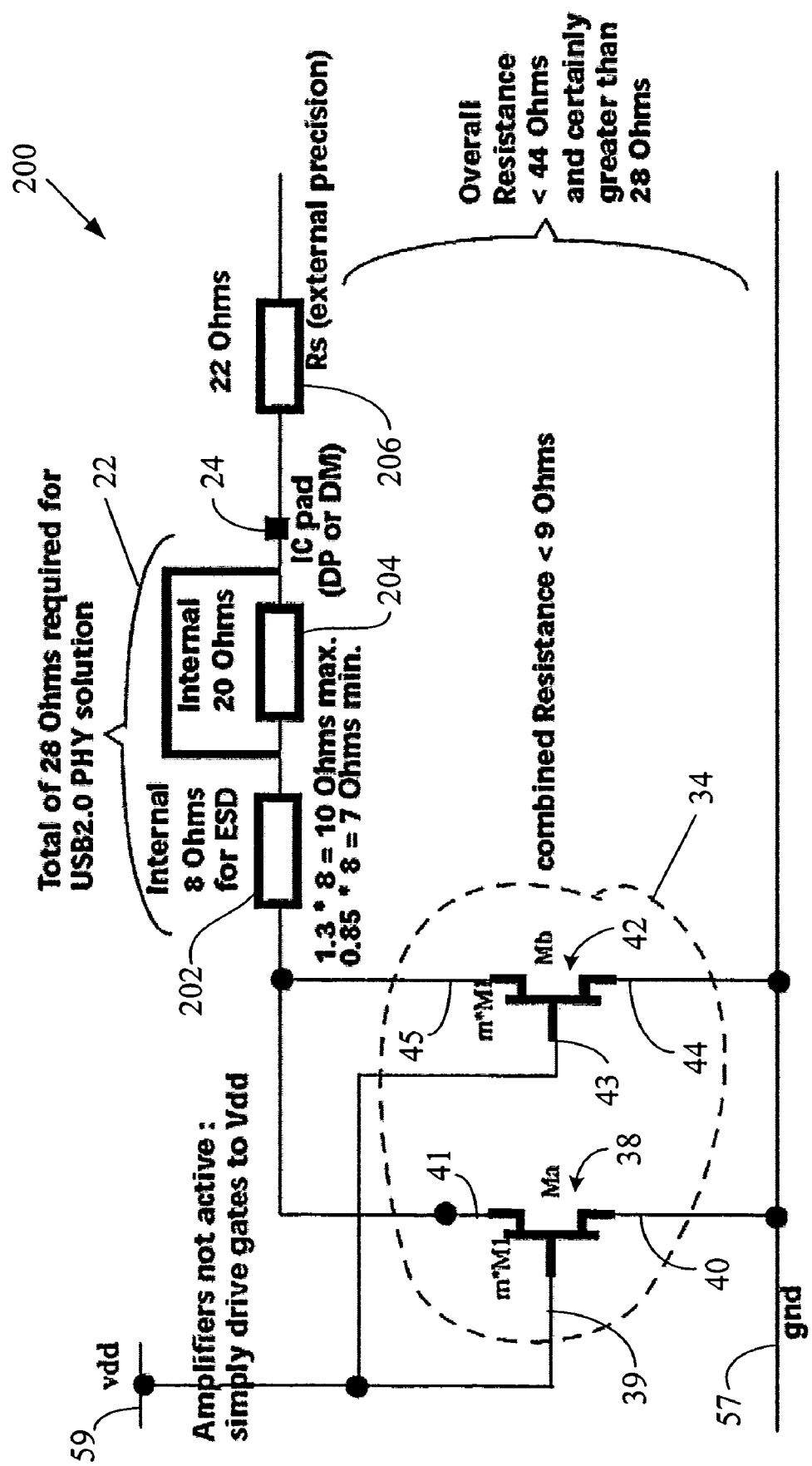
FIG. 19 illustrates a MOS driver circuit, which is identical to MOS driver in FIG. 3, but with its impedance control inhibited so as to allow the use of the driver circuit as a stand alone USB1.1 buffer.

FIG. 19 illustrates a MOS driver circuit 200, which is identical to MOS driver 32 in FIG. 3, but with its impedance control inhibited so as to allow the use of the driver circuit 32 as a stand alone USB1.1 buffer. In the embodiment of FIG. 19, the MOS driver 32 of FIG. 3 is modified so that no amplifiers shown in FIG. 3 (e.g., amplifiers 46, 60) are active (thereby inhibiting impedance control in the circuit 32 of FIG. 3). As can be seen from FIG. 19, the gates 39, 43 of the pad driver NMOS transistors Ma (38) and Mb (42), respectively, are directly driven to Vdd. In the embodiment of FIG. 19, an external 22 Ohm precision resistor 206 is used (in practice, two such 22Ω external resistors—one for DP and one for DM—may be used). A portion 204 of the internal linearizing resistor Rs 22 is deactivated or shorted out (e.g., using a metal strap). As the circuit 32 in FIG. 3 may function as a USB1.1 buffer within a USB2.0 PHY device (as discussed before), the internal linearizing resistor Rs 22 may be equal to 28 Ohms. Therefore, the portion 204 of the internal resistor Rs shorted out may equal to 20 Ohms, and the other (active) portion 202 may equal 8 Ohms for ESD (Electro Static Discharge) of any sporadic large currents. The other portion 202 of the internal resistor Rs 22 is therefore used in series with the external precision resistor 200 to obtain the desired overall pad impedance (Rpad). For example, the combined resistance of NMOS transistors Ma 38 and Mb 42 may be less than 9 Ohms, whereas the impedance spread of the active internal linearizing resistor 202 may be from 7 Ohms (minimum) to 10 Ohms (maximum). In that event, the overall impedance spread for Rpad (taking into account the external series resistor of 22 Ohms) will be from about 38 to 41 Ohms, which is within the USB1.1 stand alone impedance specification of 28 to 44 Ohms.

Some points to note about the circuit configuration of FIG. 19 are: (1) There is no need for a separate bias generator (as, for example, in the configuration of FIG. 18), thereby saving one pad on the chip design. (2) The control of slew rates may be less precise because no precise current reference is available. (3) Because of the use of external termination resistors 206 for DP and DM, there may be a need for 10 external resistors for 5 USB1.1 buffers in the configuration of FIG. 19. (4) Because of the metal strap shorting part of the internal lineraizing resistor Rs 22, the circuit layouts during chip fabrication may be different for the USB1.1 stand alone buffer in FIG. 19 and for a USB1.1 buffer (e.g., the circuit 32 in FIG. 3) inside a USB2.0 PHY.

It is noted here that all the circuit configurations shown and discussed hereinabove are as examples only. Therefore, although all the resistors in various figures in the present disclosure are shown as passive resistors, it is known to one skilled in the art that appropriate resistance may be obtained by fabricating a resistor using one or more active components (e.g., diodes, transistors, etc.). It is also pointed out that various NMOS transistors shown in different figures in the present disclosure may be replaced with suitably biased PMOS transistors and vice versa, as is known in the art. Further, except for the external components needed to complete an operational circuit (e.g., the external bias pad 186 in the embodiment of FIG. 18, or the external precision resistor 206 in the embodiment of FIG. 19, etc.), all of the circuit configurations shown in various figures (e.g., FIG. 3, FIG. 4, FIG. 9, etc.) in the present disclosure may be fabricated on a single silicon chip as is also known in the art. It is further noted that although the discussion herein of MOS linear region impedance curvature control methods has been with reference to the pad impedance specification under USB2.0, it will be apparent to one skilled in the art to employ the present impedance control methods and various circuit approaches (with suitable modifications known in the art) to obtain MOS driver/buffer circuits complying with any other specific requirements (which may be different from the requirements under USB2.0). It is still further noted that all SPICE simulations discussed throughout the disclosure were performed using a 0.11 μm CMOS fabrication process.

Figure 20:
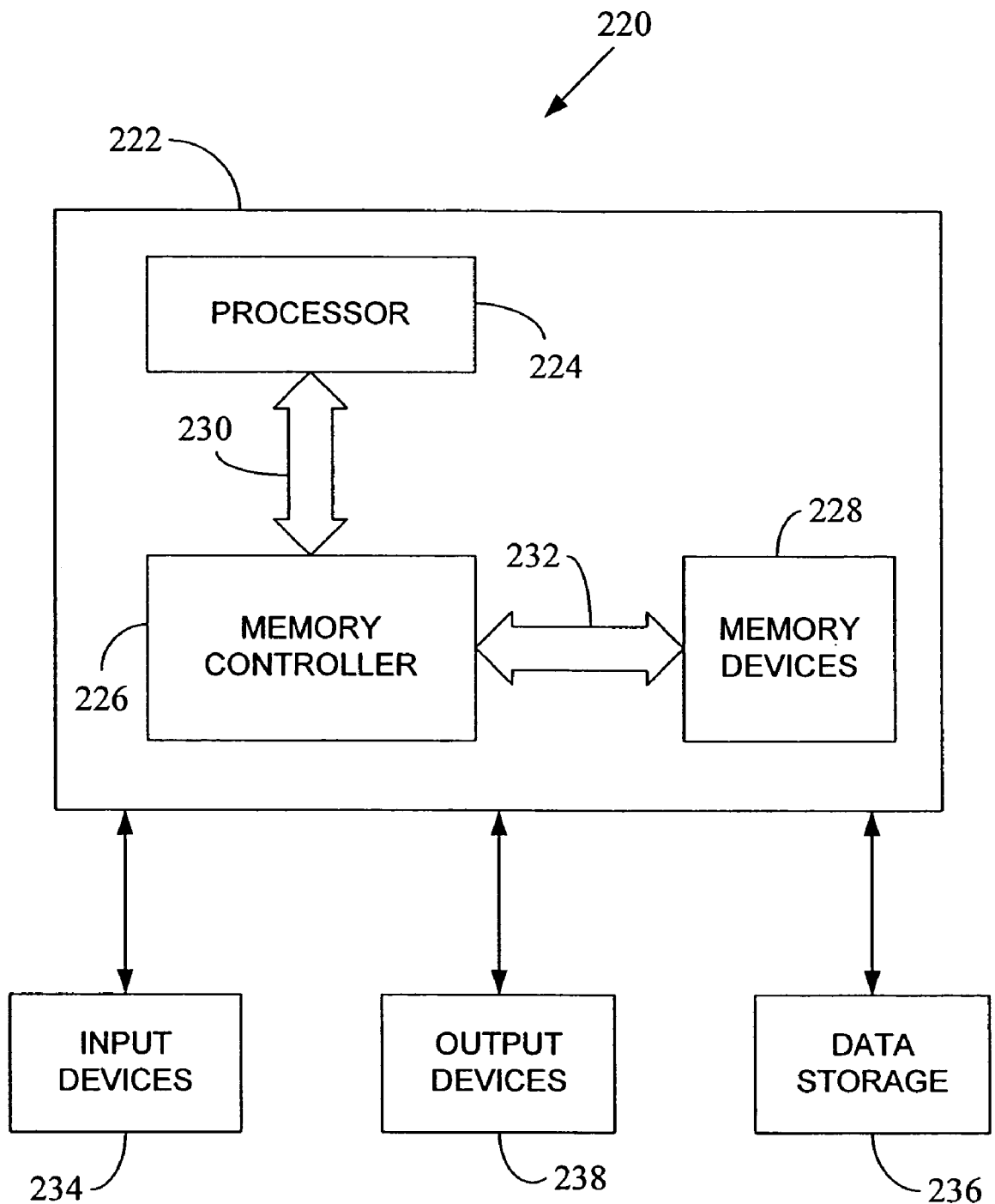
FIG. 20 is a block diagram depicting a system in which a MOS driver circuit constructed according to the teachings of the present disclosure may be used.

FIG. 20 is a block diagram depicting a system 220 in which a MOS driver circuit constructed according to the teachings of the present disclosure may be used. The system 220 may include a data processing unit or computing unit 222 that includes a processor 224 for performing various computing functions, such as executing specific software to perform specific calculations or data processing tasks. The computing unit 222 also includes a memory controller 226 that is in communication with the processor 224 through a bus 230. The bus 230 may include an address bus (not shown), a data bus (not shown), and a control bus (not shown). The memory controller 226 is also in communication with a set of memory devices 228 through another bus 232. In one embodiment, each memory device 228 is a synchronous dynamic random access memory (SDRAM). Each memory device 228 may include appropriate data storage and retrieval circuitry (not shown) as is known in the art. The processor 224 can perform a plurality of functions based on information and data stored in the SDRAMs 228. The system 220 may include one or more input devices 234 (e.g., a keyboard or a mouse) connected to the computing unit 222 to allow a user to manually input data, instructions, etc., to operate the computing unit 222. One or more output devices 238 connected to the computing unit 222 may also be provided as part of the system 220 to display or otherwise output data generated by the processor 224. Examples of output devices 238 include printers, video terminals or video display units (VDUs). In one embodiment, the system 220 also includes one or more data storage devices 236 connected to the data processing unit 222 to allow the processor 224 to store data in or retrieve data from internal or external storage media (not shown). Examples of typical data storage devices 236 include drives that accept hard and floppy disks, CD-ROMs (compact disk read-only memories), and tape cassettes. An output buffer or driver circuit in any of the circuit elements in system 220—the processor 224, the memory controller 226, one or more memory devices 228, one or more input devices 234, one or more output devices 238, and one or more storage devices 236—may be configured to include the MOS driver circuit (e.g., the circuit 32 in FIG. 3 or any of its implementations in FIGS. 4, 9 or 12) according to the present disclosure. Some examples of the devices that may include the MOS driver circuit (e.g., the driver circuit 32 in FIG. 3) are devices such as printers, computer mouse, webcams, camcorders, etc., which use USB1.1 or USB2.0 IC's.

The foregoing describes a system and method to correct or cancel MOS linear region impedance curvature. An analog solution (given its many advantages in terms of, for example, reduced complexity and conservation of silicon area) is provided to trim out the MOS linear region impedance curvature while accommodating PVT spreads in values of internal or external precision resistors. The linear region curvature correction may be obtained by using two MOS transistors in the pad driver/buffer and operating the transistors so as to proportionately increase output impedance of one of them when the output impedance of the other decreases, and vice versa. A linear pad impedance may be maintained over a range of Vpad values, while also maintaining the Vgs supplied to pad driver transistors at its maximum possible value to obtain greater linearity. The approach of the present disclosure relaxes the requirements on the voltage/current references used in the MOS pad drivers and makes tight impedance control possible, especially in a situation where the MOS fabrication process (typically all currently used processes) does not have available an internal precision resistor with a reasonably well controlled value.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of correcting impedance curvature in a MOS driver circuit, said method comprising:
   using a first MOS transistor and second MOS transistor as part of said MOS driver circuit; and
   operating said first MOS transistor and said second MOS transistor so as to compensate for changes in output impedance of said first MOS transistor through corresponding changes in output impedance of said second MOS transistor so as to maintain an output impedance of said MOS driver circuit within a desired tolerance, said operation further comprising:
   maintaining a controlled voltage at a first input terminal of said first MOS transistor, and
   using a signal adder circuit to provide a differential voltage at a second input terminal of said second MOS transistor.

2. The method of claim 1, further comprising using an amplifier to provide an input signal to said signal adder circuit.

3. The method of claim 2, wherein using said amplifier includes using an output of a differential amplifier to supply said input signal to said signal adder circuit.

4. A method of correcting impedance curvature in a MOS driver circuit, said method comprising:
   using a first MOS transistor and second MOS transistor as part of said MOS driver circuit; and
   operating said first MOS transistor and said second MOS transistor so as to increase output impedance of said second MOS transistor when output impedance of said first MOS transistor decreases, and to decrease output impedance of said second MOS transistor when output impedance of said first MOS transistor increases so as to maintain an output impedance of said MOS driver circuit within a desired tolerance, said operating further comprising:
   maintaining a controlled voltage at a first input terminal of said first MOS transistor, and
   using a signal adder circuit to provide a differential voltage at a second input terminal of said second MOS transistor.

5. The method of claim 4, further comprising using a replica of said MOS driver circuit to supply an input signal to said signal adder circuit.

6. The method of claim 5, wherein said operating further comprises:
   using an amplifier to supply said controlled voltage to said first MOS transistor and also to a third input terminal of said replica of said MOS driver circuit.

7. The method of claim 6, wherein using said amplifier further comprises using an output of a differential amplifier connected in an inverting configuration to supply said controlled voltage.

8. The method of claim 6, further comprising:
   using said amplifier with at least two inputs; and
   providing a reference voltage to at least one of said inputs of said amplifier.

9. The method of claim 5, wherein said signal adder circuit includes a differential amplifier, and wherein said input signal is supplied to an inverting input of said differential amplifier.

10. The method of claim 5, wherein using said replica includes using an output of said replica to supply said input signal to said signal adder circuit.

11. The method of claim 10, wherein using said replica further includes:
    using a third MOS transistor as part of said replica; and
    obtaining said output of said replica from a drain terminal of said third MOS transistor.

12. The method of claim 5, further comprising using a current reference to supply a current of predetermined value to said replica of said MOS driver circuit.

13. A method of correcting impedance curvature in a MOS driver circuit, said method comprising:
    using a first MOS transistor and second MOS transistor as part of said MOS driver circuit;
    using a signal adder circuit as part of said MOS driver circuit;
    maintaining a controlled voltage at a first input terminal of said first MOS transistor;
    using said signal adder circuit to provide a differential voltage at a second input terminal of said second MOS transistor; and
    operating said first MOS transistor and said second MOS transistor so as to compensate for changes in output impedance of said first MOS transistor through corresponding changes in output impedance of said second MOS transistor so as to maintain an output impedance of said MOS driver circuit within a desired tolerance.

14. The method of claim 13, wherein said operating further comprises:
    using a first output terminal of said first MOS transistor to supply an input signal to said signal adder circuit, and
    wherein using said signal adder circuit includes using an output of said signal adder circuit to provide said differential voltage to said second MOS transistor.

15. The method of claim 14, wherein said signal adder circuit is a differential amplifier, and wherein said input signal is supplied to a non-inverting input of said differential amplifier.

16. The method of claim 14, wherein said operating further comprises using said first output terminal along with a second output terminal of said second MOS transistor in series with a linearizing resistor.

17. The method of claim 16, wherein said linearizing resistor is integrally fabricated with said MOS driver circuit.

18. The method of claim 17, wherein said linearizing resistor is fabricated to have a nominal resistance in the range of 22 Ohms to 28 Ohms.

19. A method of correcting impedance curvature in a MOS driver circuit, said method comprising:
using a first MOS transistor and second MOS transistor as part of said MOS driver circuit;
using a signal adder circuit as part of said MOS driver circuit; maintaining a controlled voltage at a first input terminal of said first MOS transistor; using said signal adder circuit to provide a differential voltage at a second input terminal of said second MOS transistor; and
operating said first MOS transistor and said second MOS transistor so as to increase output impedance of said second MOS transistor when output impedance of said first MOS transistor decreases, and to decrease output impedance of said second MOS transistor when output impedance of said first MOS transistor increases so as to maintain an output impedance of said MOS driver circuit within a desired tolerance.

20. The method of claim 19, further comprising:
using a first amplifier to supply a first input signal to said signal adder circuit;
using a scaled replica of said MOS driver circuit to supply a second input signal to said first amplifier; and
using a second amplifier to supply said controlled voltage to a third input terminal of said scaled replica.

21. The method of claim 20, wherein said operating further comprises using said second amplifier to supply said controlled voltage to said first MOS transistor.

22. The method of claim 20, wherein said operating further comprises using said first amplifier to supply said controlled voltage to said first MOS transistor.

23. The method of claim 20, further comprising using a current reference to supply a current of predetermined value to said scaled replica of said MOS driver circuit.

24. The method of claim 23, wherein said predetermined value of said current from said current reference ranges from 0.68 mA to 1 mA.

25. A MOS driver circuit comprising:
a first MOS transistor configured to receive a controlled voltage at a first input terminal thereof;
a second MOS transistor coupled to said first MOS transistor and configured to receive a differential voltage at a second input terminal thereof,
wherein said second MOS transistor is configured to have an increased output impedance when output impedance of said first MOS transistor decreases, and to have a decreased output impedance when output impedance of said first MOS transistor increases so as to maintain an output impedance of said MOS driver circuit within a desired tolerance; and
a signal adder circuit coupled to said first and said second MOS transistors, wherein a first output of said signal adder circuit is coupled to said second input terminal to provide said differential voltage to said second MOS transistor.

26. The MOS driver circuit of claim 25, wherein said first and said second input terminals are respective gate terminals of said first and said second MOS transistors.

27. The MOS driver circuit of claim 25, wherein said signal adder circuit includes a differential amplifier.

28. The MOS driver circuit of claim 25, further comprising:
an amplifier having a second output coupled to said first input terminal to provide said controlled voltage to said first MOS transistor, wherein said amplifier further having a third output coupled to an input of said signal adder circuit to provide a bias voltage thereto.

29. A MOS driver circuit comprising:
a first MOS transistor configured to receive a controlled voltage at a first input terminal thereof;
a second MOS transistor coupled to said first MOS transistor and configured to receive a differential voltage at a second input terminal thereof;
wherein said second MOS transistor is configured to compensate for changes in output impedance of said first MOS transistor through corresponding changes in output impedance of said second MOS transistor so as to maintain an output impedance of said MOS driver circuit within a desired tolerance; and
a signal adder circuit coupled to said first and said second MOS transistors, wherein a first output of said signal adder circuit is coupled to said second input terminal to provide said differential voltage to said second MOS transistor.

30. The MOS driver circuit of claim 29, further comprising:
a scaled replica of said MOS driver circuit having a second output coupled to a first input of said signal adder circuit to provide a first input voltage thereto.

31. The MOS driver circuit of claim 30, wherein said first input is an inverting input of said signal adder circuit.

32. The MOS driver circuit of claim 30, wherein a first output terminal of said first MOS transistor is coupled to a second input of said signal adder circuit to provide a second input voltage thereto.

33. The MOS driver circuit of claim 32, wherein said second input is a non-inverting input of said signal adder circuit.

34. The MOS driver circuit of claim 32, wherein said first output terminal of said first MOS transistor and a second output terminal of said second MOS transistor are coupled in series with a linearizing resistor.

35. The MOS driver circuit of claim 34, wherein said first and said second output terminals are respective drain terminals of said first and said second MOS transistors.

36. The MOS driver circuit of claim 34, wherein said linearizing resistor is integrally fabricated with said first and said second MOS transistors, and wherein nominal resistance of said linearizing resistor is in the range of 22 Ohms to 28 Ohms.

37. A system comprising:
a processor;
a memory controller;
a memory device;
a first bus interconnecting the processor and the memory controller; and
a second bus interconnecting the memory controller and the memory device, wherein at least one of said processor, said memory controller, and said memory device includes a MOS driver circuit comprising:
- a first MOS transistor configured to receive a controlled voltage at a first input terminal thereof;
- a second MOS transistor coupled to said first MOS transistor and configured to receive a differential voltage at a second input terminal thereof, wherein said second MOS transistor is configured to compensate for changes in output impedance of said first MOS transistor through corresponding changes in output impedance of said second MOS transistor so as to maintain an output impedance of said MOS driver circuit within a desired tolerance; and
- a signal adder circuit coupled to said first and said second MOS transistors, wherein a first output of said signal adder circuit is coupled to said second input terminal to provide said differential voltage to said second MOS transistor.

38. A system comprising:
a data processing unit including:
- a processor,
- a memory controller,
- a memory device,
- a first bus interconnecting the processor and the memory controller, and
- a second bus interconnecting the memory controller and the memory device;

an input device connected to said data processing unit;
an output device connected to said data processing unit; and
a data storage device connected to said data processing unit, wherein at least one of said processor, said memory controller, said memory device, said input device, said output device, and said data storage device includes a MOS driver circuit comprising:
- a first MOS transistor configured to receive a controlled voltage at a first input terminal thereof;
- a second MOS transistor coupled to said first MOS transistor and configured to receive a differential voltage at a second input terminal thereof wherein said second MOS transistor is configured to have an increased output impedance when output impedance of said first MOS transistor decreases, and to have an decreased output impedance when output impedance of said first MOS transistor increases so as to maintain an output impedance of said MOS driver circuit within a desired tolerance; and
- a signal adder circuit coupled to said first and said second MOS transistors, wherein a first output of said signal adder circuit is coupled to said second input terminal to provide said differential voltage to said second MOS transistor.

* * * * *